(12) United States Patent
Fukui et al.

(10) Patent No.: US 10,381,489 B2
(45) Date of Patent: Aug. 13, 2019

(54) TUNNEL FIELD EFFECT TRASNSISTOR

(71) Applicants: NATIONAL UNIVERSITY CORPORATION HOKKAIDO UNIVERSITY, Sapporo-shi, Hokkaido (JP); JAPAN SCIENCE AND TECHNOLOGY AGENCY, Kawaguchi-shi, Saitama (JP)

(72) Inventors: Takashi Fukui, Sapporo (JP); Katsuhiro Tomioka, Sapporo (JP)

(73) Assignees: National University Corporation Hokkaido University, Sapporo-shi, Hokkaido (JP); Japan Science and Technology Agency, Kawaguchi-shi, Saitama (JP)

( * ) Notice: Subject to any disclaimer, the term of this patent is extended or adjusted under 35 U.S.C. 154(b) by 0 days.

(21) Appl. No.: 15/764,426

(22) PCT Filed: Sep. 27, 2016

(86) PCT No.: PCT/JP2016/078393
§ 371 (c)(1),
(2) Date: Mar. 29, 2018

(87) PCT Pub. No.: WO2017/057329
PCT Pub. Date: Jun. 4, 2017

(65) Prior Publication Data
US 2018/0294362 A1    Oct. 11, 2018

(30) Foreign Application Priority Data

Sep. 30, 2015  (JP) ................................. 2015-193196

(51) Int. Cl.
*H01L 29/786* (2006.01)
*H01L 29/66* (2006.01)
(Continued)

(52) U.S. Cl.
CPC ...... *H01L 29/78696* (2013.01); *H01L 27/095* (2013.01); *H01L 29/045* (2013.01);
(Continued)

(58) Field of Classification Search
CPC . H01L 29/78696; H01L 29/045; H01L 29/06; H01L 29/0676; H01L 29/205;
(Continued)

(56) References Cited

U.S. PATENT DOCUMENTS

| 2011/0169012 A1 | 7/2011 | Hersee et al. |
| 2012/0025169 A1 | 2/2012 | Mars et al. |
| 2016/0043234 A1* | 2/2016 | Alper ................ H01L 29/78648 327/537 |
| 2016/0204224 A1 | 7/2016 | Fukui et al. |

FOREIGN PATENT DOCUMENTS

| JP | 08-196271 A | 7/1996 |
| JP | 2013-187291 A | 9/2013 |

(Continued)

OTHER PUBLICATIONS

International Search Report from International Application No. PCT/JP2016/078393 dated Nov. 8, 2016.
(Continued)

*Primary Examiner* — Feifei Yeung Lopez
(74) *Attorney, Agent, or Firm* — Brundidge & Stanger, P.C.

(57) ABSTRACT

The tunnel field effect transistor according to the present invention has: a channel; a source electrode connected directly or indirectly to one end of the channel; a drain electrode connected directly or indirectly to the other end of the channel; and a gate electrode for causing an electric field to act on the channel, generating a tunnel phenomenon at the source electrode-side joint part of the channel, and simultaneously generating a two-dimensional electron gas in the channel.

5 Claims, 14 Drawing Sheets

(51) Int. Cl.
  *H01L 29/778*  (2006.01)
  *H01L 29/78*   (2006.01)
  *H01L 27/095*  (2006.01)
  *H01L 29/808*  (2006.01)
  *H01L 29/812*  (2006.01)
  *H01L 29/06*   (2006.01)
  *H01L 29/04*   (2006.01)
  *H01L 29/205*  (2006.01)

(52) U.S. Cl.
  CPC .......... *H01L 29/06* (2013.01); *H01L 29/0676* (2013.01); *H01L 29/205* (2013.01); *H01L 29/66* (2013.01); *H01L 29/778* (2013.01); *H01L 29/78* (2013.01); *H01L 29/78642* (2013.01); *H01L 29/808* (2013.01); *H01L 29/812* (2013.01)

(58) Field of Classification Search
  CPC ....... H01L 29/66; H01L 29/778; H01L 29/78; H01L 29/78642
  See application file for complete search history.

(56) References Cited

FOREIGN PATENT DOCUMENTS

| WO | 2006/135336 A1 | 12/2006 |
| WO | 2015/022777 A1 | 2/2015 |

OTHER PUBLICATIONS

Tomioka, K., Yoshimura, M. and Fukui, T., "Sub 60 mV/decade Switch Using an InAs Nanowire-Si Heterojunction and Turn-on Voltage Shift with a Pulsed Doping Technique", Nano Lett., vol. 13, pp. 5822-5826., Nov. 11, 2013.

Kunio Takayanagi, Yasumasa Tanishiro, Shigeki Takahashi and Masaetsu Takahashi, "Structure Analysis of Si(111)-7×7 Reconstructed Surface by Transmission Electron Diffraction",Surface Science vol. 164, pp. 367-392., Aug. 1, 1985.

The extended European search report dated Apr. 8, 2019 for the corresponding European Application No. 16851500.5.

* cited by examiner

TUNNEL FIELD EFFECT TRASNSISTOR

TECHNICAL FIELD

The present invention relates to a tunnel-field-effect transistor having a tunnel-field-effect-transistor (TFET) structure and a high-electron-mobility-transistor (HEMT) structure.

BACKGROUND ART

Semiconductor microprocessors and large scale integrated circuits are manufactured by integrating elements such as a metal-oxide-semiconductor (MOS) field effect transistor (FET) on a semiconductor substrate. Complementary MOSFETs (CMOS) are generally basic elements (switch elements) of such integrated circuits. As the material for semiconductor substrates, silicon which is a group IV semiconductor is mainly used. The integration density and performance of semiconductor microprocessors and large scale integrated circuits can be improved by reducing the size of transistors making up a CMOS. One of problems accompanied by reduction of the size of the CMOS is an increase of power consumption. An increase in the number of CMOSs that can be mounted on one microchip and an increase of leakage current caused by a short channel effect are main factors of the increase of power consumption. Among them, the increase of leakage current leads to an increase of a supply voltage. In view of this, it is necessary to suppress the leakage current and reduce the driving voltage for each CMOS.

As an index of a switching performance of a CMOS, a subthreshold coefficient (mV/decade) is used. The subthreshold coefficient corresponds to a minimum drive voltage to turn the MOSFET into an ON state. The switch characteristic of the conventional MOSFET is based on a diffusion phenomenon of electrons and holes (carriers). Therefore, with the conventional MOSFET, the theoretical minimum value of the subthreshold coefficient is 60 mV/decade, and it is not possible to realize a switching performance with a subthreshold coefficient smaller than that value.

A tunnel-field-effect transistor (TFET) is reported as a switch element that operates at a smaller subthreshold coefficient beyond the above-mentioned physical theoretical limitation. Since the tunnel-field-effect transistor does not cause the short channel effect and can realize a high ON/OFF ratio with a low voltage, the tunnel-field-effect transistor is considered to be a promising next-generation switch element. In recent years, a tunnel-field-effect transistor using a group III-V compound semiconductor nanowire is reported (see, for example, see Non-PTL 1).

Non-PTL 1 discloses a tunnel-field-effect transistor including a p-type silicon (111) substrate, an InAs nanowire disposed on the (111) surface of the silicon substrate perpendicular to the substrate surface, a source electrode connected with the silicon substrate, a drain electrode connected with the InAs nanowire, and a gate electrode disposed at a position where the interface between the silicon substrate and the InAs nanowire can be affected. It is reported that this tunnel-field-effect transistor can be operated with a small subthreshold coefficient (60 mV/decade or smaller).

CITATION LIST

Non-PTL

Non-PTL 1
Tomioka, K., Yoshimura, M. and Fukui, T., "Sub 60 mV/decade Switch Using an InAs Nanowire-Si Heterojunction and Turn-on Voltage Shift with a Pulsed Doping Technique", Nano Lett., Vol. 13, pp. 5822-5826.

SUMMARY OF INVENTION

Technical Problem

However, conventional tunnel-field-effect transistors are disadvantageous in that the current value is significantly small in comparison with MOSFETs since tunnel transport is utilized.

An object of the present invention is to provide a tunnel-field-effect transistor that can be operated with a small subthreshold coefficient (60 mV/decade or smaller) and can achieve a current value greater than conventional tunnel-field-effect transistors.

Solution to Problem

The present inventor found that the above-mentioned problems can be solved by combining a tunnel-field-effect-transistor (TFET) structure and a high-electron-mobility-transistor (HEMT) structure so as to simultaneously generate tunneling and two-dimensional electron gas with one gate electrode, and the present inventor has completed the present invention through further studies.

Specifically, the present invention relates to the following tunnel-field-effect transistor and switch element.

[1] A tunnel-field-effect transistor including: a channel; a source electrode directly or indirectly connected with one end of the channel; a drain electrode directly or indirectly connected with another end of the channel; and a gate electrode configured to operate such that an electric field acts on the channel to cause tunneling at a junction of the channel on the source electrode side while generating two-dimensional electron gas at the channel.

[2] The tunnel-field-effect transistor according to [1] including: a substrate including a (111) surface and made of a group IV semiconductor doped to be a first conductivity type; an insulating film covering the (111) surface of the substrate and including an opening; a core-multishell nanowire made of a group III-V compound semiconductor, the core-multishell nanowire being disposed on the (111) surface of the substrate exposed in the opening and on the insulating film at a peripheral portion of the opening; one of the source electrode and the drain electrode connected with the substrate; the other of the source electrode and the drain electrode connected with the core-multishell nanowire; a gate insulating film disposed on a side surface of the core-multishell nanowire; and the gate electrode disposed on the gate insulating film and configured to operate such that an electric field acts on at least a part of the core-multishell nanowire. The core-multishell nanowire includes: a center nanowire made of a group III-V compound semiconductor, the center nanowire including a first region connected with the (111) surface of the substrate exposed in the opening, and a second region connected with the first region and doped to be a second conductivity type different from the first conductivity type, the center nanowire being the channel, a barrier layer made of a group III-V compound semiconductor having a band gap greater than a band gap of the group III-V compound semiconductor of the center nanowire, the barrier layer covering a side surface of the center nanowire, a modulation dope layer made of a group III-V compound semiconductor of the second conductivity type having a band gap greater than the band gap of the group III-V compound semiconductor of the center nanowire and smaller than the band gap of the group III-V compound semiconductor of the barrier layer, the modulation dope layer covering the barrier layer, and a cap layer made of a group III-V compound semiconductor having a band gap equal to or greater than the group III-V compound semiconductor of the center nanowire, the cap layer covering the modulation dope layer, the first region is an intrinsic semiconductor, or is doped to be the second conductivity type such that an impurity concentration of the first region is lower than an impurity concentration of the second region; the barrier layer is an intrinsic semiconductor, or is doped to be the second conductivity type such that an impurity concentration of the barrier layer is lower than an impurity concentration of the modulation dope layer; the cap layer is an intrinsic semiconductor, or is doped to be the second conductivity type such that an impurity concentration of the cap layer is lower than the impurity concentration of the modulation dope layer; the other of the source electrode and the drain electrode is connected with the second region of the center nanowire; and the gate electrode operates such that an electric field acts on a junction interface between the (111) surface of the substrate and the center nanowire and the first region of the center nanowire to cause tunneling at the junction interface while generating the two-dimensional electron gas at the first region.

[3] In the tunnel-field-effect transistor according to [2], the core-multishell nanowire further includes a first spacer layer disposed between the barrier layer and the modulation dope layer, and made of a group III-V compound semiconductor having a composition identical to a composition of the group III-V compound semiconductor of the modulation dope layer, and a second spacer layer disposed between the modulation dope layer and the cap layer, and made of a group III-V compound semiconductor having a composition identical to the composition of the group III-V compound semiconductor of the modulation dope layer and to the composition of the group III-V compound semiconductor of the first spacer layer; and a band gap of the first spacer layer and a band gap of the second spacer layer are greater than the band gap of the group III-V compound semiconductor of the center nanowire and smaller than the band gap of the group III-V compound semiconductor of the barrier layer.

[4] In the tunnel-field-effect transistor according to [2] or [3], the impurity concentration of the modulation dope layer falls within a range of $10^{17}$ to $10^{21}$ cm$^{-3}$.

[5] A switch element includes the tunnel-field-effect transistor according to any one of [1] to [4].

Advantageous Effects of Invention

With the present invention, it is possible to provide a tunnel-field-effect transistor and a switch element that can be operated with a small subthreshold coefficient (60 mV/decade or smaller) and can achieve a large current value. With the tunnel-field-effect transistor according to the embodiment of the present invention, the integration density and the performance of a semiconductor microprocessor and a high density integrated circuit can be improved while suppressing the power consumption amount of the semiconductor microprocessor and the high integrated circuit.

DESCRIPTION OF EMBODIMENTS

1. Tunnel-Field-Effect Transistor

Figure 1:
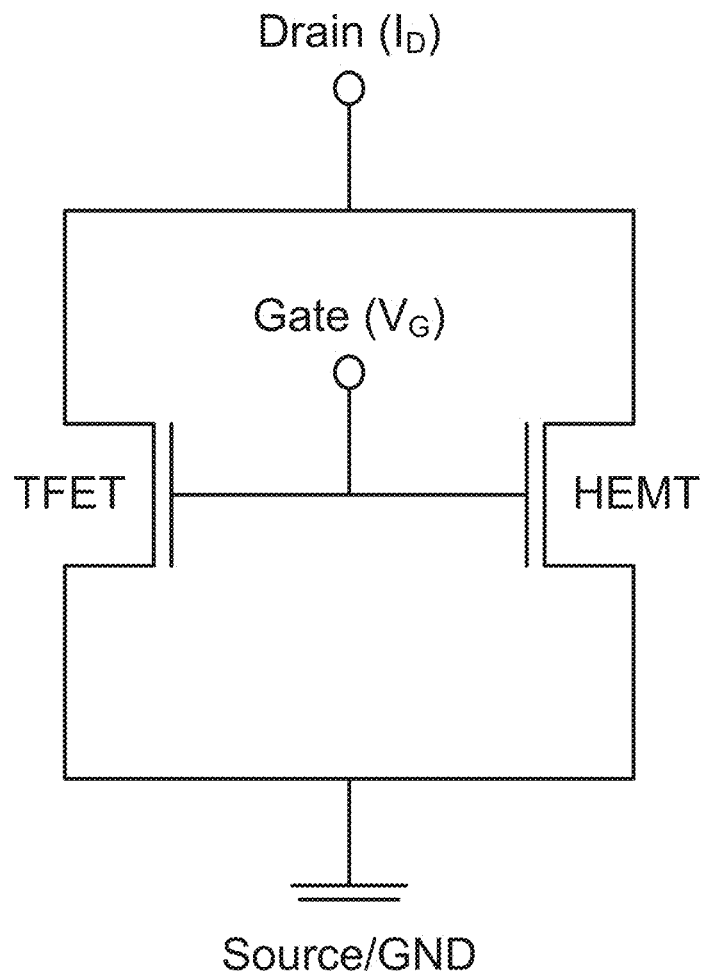
FIG. 1 illustrates an example of an equivalent circuit of a tunnel-field-effect transistor according to an embodiment of the present invention.

The tunnel-field-effect transistor according to an embodiment of the present invention (TFET) includes: a channel, a source electrode directly or indirectly connected with one end of the channel, a drain electrode directly or indirectly connected with another end of the channel, and a gate electrode that operates such that an electric field acts on the channel. The gate electrode operates such that an electric field acts on the channel to cause tunneling at a junction of the channel on the source electrode side while generating two-dimensional electron gas at the channel. As a feature thereof, the tunnel-field-effect transistor according to the embodiment of the present invention has both a tunnel-fieldeffect-transistor (TFET) structure and a high-electron-mobility transistor (HEMT). FIG. 1 illustrates an example of the equivalent circuit of the tunnel-field-effect transistor according to the embodiment of the present invention. A tunnel-field-effect transistor including a substrate made of a group IV semiconductor and a core-multishell nanowire made of a group III-V compound semiconductor is described below as an example of the tunnel-field-effect transistor according to the embodiment of the present invention.

Figure 2:
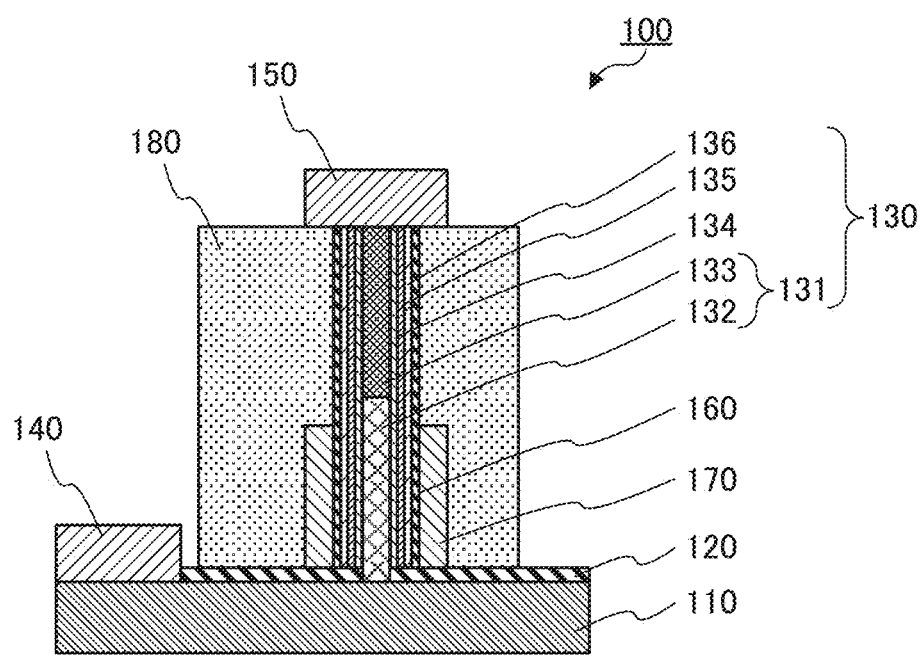
FIG. 2 is a schematic cross-sectional view illustrating a configuration of the tunnel-field-effect transistor according to the embodiment of the present invention.

FIG. 2 is a schematic cross-sectional view illustrating a configuration of tunnel-field-effect transistor 100 according to the embodiment of the present invention. As illustrated in FIG. 2, tunnel-field-effect transistor 100 according to the present embodiment includes substrate 110, insulating film 120, core-multishell nanowire 130, source electrode 140, drain electrode 150, gate insulating film 160, gate electrode 170 and isolation protective film 180. In tunnel-field-effect transistor 100 according to the present embodiment, when a voltage is applied to gate electrode 170, tunneling occurs at the junction interface between the (111) surface of substrate 110 and center nanowire 131 of core-multishell nanowire 130, and two-dimensional electron gas is generated at an outer periphery portion of center nanowire 131. The components are described below.

Substrate 110 is made of a group IV semiconductor such as silicon and germanium, and includes a (111) surface. Substrate 110 is doped to be a first conductivity type (n-doped or p-doped). For example, the substrate is an n-type silicon (111) substrate or a p-type silicon (111) substrate.

Insulating film 120 covers the (111) surface of substrate 110, and includes one or more openings. Insulating film 120 functions as a mask pattern at the time of growing center nanowire 131 from the (111) surface of substrate 110. The material of insulating film 120 is not limited as long as the material can inhibit the growth of the center nanowire and as the material is an insulator. Examples of the material of insulating film 120 include silicon oxide ($SiO_2$), silicon nitride (SiN), aluminum oxide ($Al_2O_3$) and the like. Insulating film 120 may be formed of a single layer, or two layers. The film thickness of insulating film 120 is not limited as long as an appropriate insulating performance is obtained. For example, insulating film 120 is a silicon oxide film having a film thickness of 20 nm.

The opening of insulating film 120 extends therethrough to the (111) surface of substrate 110, and the (111) surface of substrate 110 is exposed in the opening. The opening defines the growth position, thickness and shape of center nanowire 131 at the time of manufacturing tunnel-field-effect transistor 100 according to the present embodiment. The shape of the opening is not limited and can be arbitrarily determined. Examples of the shape of the opening include triangular, rectangular, hexagonal and circular. It suffices that the diameter of the circumcircle of the opening is approximately 2 to 500 nm. In the case where two or more openings are provided, it suffices that the center-to-center distance of the openings is several tens of nanometers to several micrometers.

Core-multishell nanowire 130 is a structure having a core-multishell structure made of a group III-V compound semiconductor, and has a diameter of 7.6 nm to 1 μm and a length of 100 nm to 100 μm. Core-multishell nanowire 130 is disposed on the (111) surface of substrate 110 exposed in the opening of insulating film 120 and on a part of insulating film 120 around the (111) surface of substrate 110 exposed in the opening such that the major axis of core-multishell nanowire 130 is perpendicular to the (111) surface of the substrate. To be more specific, center nanowire 131 of core-multishell nanowire 130 is disposed on the (111) surface of substrate 110 exposed in the opening of insulating film 120, and barrier layer 134, modulation dope layer 135 and cap layer 136 that cover the side surface of center nanowire 131 are disposed on a part of insulating film 120 around the opening. By forming center nanowire 131 on the (111) surface of substrate 110, center nanowire 131 can be disposed perpendicularly to the (111) surface.

Figure 3A:
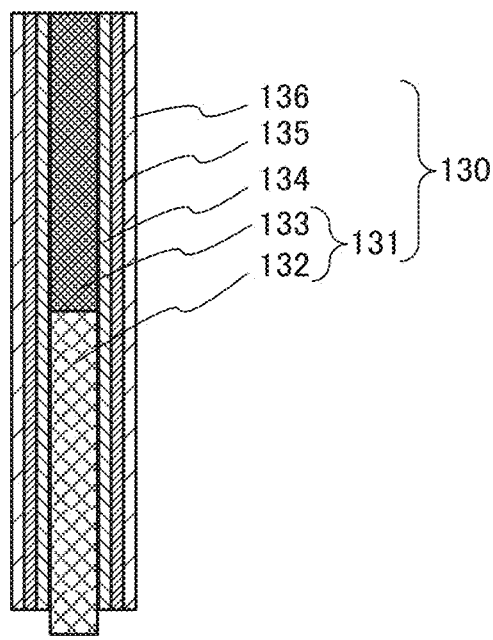
FIG. 3A is an enlarged sectional view of a core-multishell nanowire of the tunnel-field-effect transistor illustrated in FIG. 2.

FIG. 3A is an enlarged sectional view of core-multishell nanowire 130. As illustrated in FIG. 3A, core-multishell nanowire 130 includes center nanowire 131, barrier layer 134 that covers the side surface (which extends in the axial direction and does not intersect the center line) of center nanowire 131, modulation dope layer 135 that covers barrier layer 134, and cap layer 136 that covers modulation dope layer 135. All cover layers (barrier layer 134, modulation dope layer 135 and cap layer 136) cover the side surface of center nanowire 131, but do not cover two end surfaces (which intersect the center line extending in the axial direction) of center nanowire 131. The film thickness of the entirety of the cover layers is not limited, and it suffices that the film thickness of the entirety of the cover layers is approximately 2.8 to 250 nm.

Center nanowire 131 is made of a group III-V compound semiconductor, and is extended upward from the (111) surface of substrate 110 through the opening of insulating film 120. The group III-V compound semiconductor of center nanowire 131 may be any of a binary compound semiconductor, a ternary compound semiconductor, or quaternary or greater compound semiconductors. Examples of the binary compound semiconductor include InAs, InP, GaAs, GaN, InSb, GaSb and AlSb. Examples of the ternary compound semiconductor include AlGaAs, InGaAs, InGaN, AlGaN, GaNAs, InAsSb, GaAsSb, InGaSb and AlInSb. Examples of the quaternary compound semiconductor include InGaAlN, AlInGaP, InGaAsP, GaInAsN, InGaAlSb, InGaAsSb and AlInGaPSb. It suffices that the thickness (the diameter of the circumcircle in the cross-section orthogonal to the axial direction) of center nanowire 131 is approximately 2 to 500 nm. In addition, it suffices that the length of center nanowire 131 is approximately 100 nm to 100 μm. For example, center nanowire 131 is an $In_{0.7}Ga_{0.3}As$ nanowire having a thickness of 30 nm or 70 nm.

Center nanowire 131 includes first region 132 that is connected with the (111) surface of substrate 110 and is configured to function as a channel, and second region 133 that is connected with first region 132 and is doped to be a second conductivity type (p-doped or n-doped) that is different from the conductivity type (first conductivity type) of substrate 110. First region 132 is an intrinsic semiconductor, or is doped to be the second conductivity type (p-doped or n-doped) such that the impurity concentration thereof is lower than the impurity concentration of second region 133. Preferably, first region 132 is an intrinsic semiconductor. For example, in the case where substrate 110 is a p-type silicon (111) substrate, first region 132 is made of an undoped $In_{0.7}Ga_{0.3}As$ nanowire, and second region 133 is made of an n-doped $In_{0.7}Ga_{0.3}As$ nanowire. In addition, in the case where substrate 110 is an n-type silicon (111) substrate, first region 132 is made of an undoped $In_{0.7}Ga_{0.3}As$ nanowire, and second region 133 is made of a p-doped $In_{0.7}Ga_{0.3}As$ nanowire. Second region 133 is connected with drain electrode 150. Basically, first region 132 of center nanowire 131 and the (111) surface of substrate 110 form a dislocation-free and defect-free junction interface.

Barrier layer 134 covers the side surface of center nanowire 131. Barrier layer 134 has a function of setting the threshold of the high-electron-mobility transistor (HEMT) to positive (a function of forming two-dimensional electron gas in center nanowire 131 when a positive gate voltage is applied to gate electrode 170). Barrier layer 134 is in contact with insulating film 120, and not in contact with substrate 110. Barrier layer 134 is made of a group III-V compound semiconductor having a band gap greater than that of the group III-V compound semiconductor of center nanowire 131, and that of the group III-V compound semiconductor of modulation dope layer 135. In addition, the group III-V compound semiconductor of barrier layer 134 is an intrinsic semiconductor, or is doped to be the second conductivity type (p-doped or n-doped) such that the impurity concentration thereof is lower than the impurity concentration of modulation dope layer 135. Preferably, barrier layer 134 is an intrinsic semiconductor. The group III-V compound semiconductor of barrier layer 134 is not limited as long as the above-mentioned conditions are satisfied. Examples of the group III-V compound semiconductor of barrier layer 134 are identical to the above-mentioned examples of the group III-V compound semiconductor of center nanowire 131. The film thickness of barrier layer 134 is not limited, and for example, it suffices that the film thickness of barrier layer 134 is approximately 0.5 to 10 nm. For example, in the case where center nanowire 131 is an InGaAs nanowire, barrier layer 134 is an undoped InP layer having a film thickness of 8 nm.

Modulation dope layer 135 covers barrier layer 134. Modulation dope layer 135 is in contact with insulating film 120, and not in contact with substrate 110. Modulation dope layer 135 is made of a group III-V compound semiconductor having a band gap greater than that of the group III-V compound semiconductor of center nanowire 131, and smaller than that of the group III-V compound semiconductor of barrier layer 134. Examples of the group III-V compound semiconductor of modulation dope layer 135 are identical to the above-mentioned examples of the group III-V compound semiconductor of center nanowire 131. The group III-V compound semiconductor of modulation dope layer 135 is doped to be the second conductivity type. Preferably, the impurity concentration of modulation dope layer 135 falls within a range of $10^{17}$ to $10^{20}$ $cm^{-3}$. The film thickness of modulation dope layer 135 is not limited, and it suffices that the film thickness of modulation dope layer 135 is approximately 0.3 to 10 nm. For example, in the case where center nanowire 131 is an InGaAs nanowire and barrier layer 134 is an InP layer, modulation dope layer 135 is an Si-doped InAlAs layer having a film thickness of 5 nm.

Cap layer 136 covers modulation dope layer 135. Cap layer 136 has a function of inactivating the surface of core-multishell nanowire 130 and a function of forming a favorable junction interface together with gate insulating film 160. Cap layer 136 is in contact with insulating film 120, and not in contact with substrate 110. Cap layer 136 is made of a group III-V compound semiconductor having a band gap greater than that of the group III-V compound semiconductor of center nanowire 131. In addition, the group III-V compound semiconductor of cap layer 136 is an intrinsic semiconductor, or is doped to be the second conductivity type (p-doped or n-doped) such that the impurity concentration thereof is lower than the impurity concentration of modulation dope layer 135. Preferably, cap layer 136 is an intrinsic semiconductor. The group III-V compound semiconductor of cap layer 136 is not limited as long as the above-mentioned conditions are satisfied. For example, the group III-V compound semiconductor of cap layer 136 may be identical to the group III-V compound semiconductor of center nanowire 131.

Examples of the group III-V compound semiconductor of cap layer 136 are identical to the examples of the group III-V compound semiconductor of center nanowire 131. The film thickness of cap layer 136 is not limited, and it suffices that the film thickness of cap layer 136 is approximately 1 to 10 nm. For example, in the case where center nanowire 131 is an InGaAs nanowire, cap layer 136 is an undoped InGaAs layer having a film thickness of 7 nm.

Figure 3B:
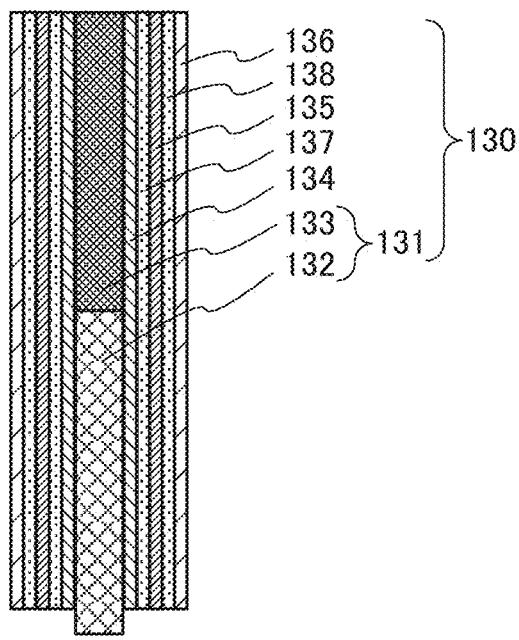
FIG. 3B is an enlarged sectional view of a modification of the core-multishell nanowire.

FIG. 3B is an enlarged sectional view of a modification of core-multishell nanowire 130. As illustrated in FIG. 3B, core-multishell nanowire 130 further includes first spacer layer 137 disposed between barrier layer 134 and modulation dope layer 135, and second spacer layer 138 disposed between modulation dope layer 135 and cap layer 136. Both first spacer layer 137 and second spacer layer 138 are in contact with insulating film 120, and neither of them is in contact with substrate 110. In addition, each of first spacer layer 137 and second spacer layer 138 is made of a group III-V compound semiconductor of a composition identical to that of the group III-V compound semiconductor of modulation dope layer 135. The group III-V compound semiconductor of first spacer layer 137 has a band gap greater than that of the group III-V compound semiconductor of center nanowire 131 and smaller than that of the group III-V compound semiconductor of barrier layer 134. It suffices that the film thickness of first spacer layer 137 and second spacer layer 138 is approximately 1 to 10 nm, for example. For example, each of first spacer layer 137 and second spacer layer 138 is an undoped InAlAs layer having a film thickness of 10 nm in the case where center nanowire 131 is an InGaAs nanowire, barrier layer 134 is an InP layer, and modulation dope layer 135 is an InAlAs layer.

Source electrode 140 is connected with the source region of tunnel-field-effect transistor 100, and drain electrode 150 is connected with the drain region of tunnel-field-effect transistor 100. For example, in the case where substrate 110, first region 132 of center nanowire 131, and second region 133 of center nanowire 131 function as the source region, the channel, and the drain region, respectively, source electrode 140 and drain electrode 150 are connected with substrate 110 and second region 133 of center nanowire 131, respectively as illustrated in FIG. 2. On the other hand, in the case where second region 133 of center nanowire 131, first region 132 of center nanowire 131, and substrate 110 function as the source region, the channel, and the drain region, respectively, source electrode 140 and drain electrode 150 are connected with second region 133 of center nanowire 131 and substrate 110, respectively. The type of the electrode connected with substrate 110 is not limited, but preferably is a metal film, an alloy film, a metal multilayer film, or a silicide metal film that can make ohmic contact with substrate 110. Examples of the metal multilayer film that can make ohmic contact with substrate 110 include a Ti/Au multilayer film and an Ni/Au multilayer film. Examples of the silicide metal film that can make ohmic contact with substrate 110 include an NiSi film and a TiSi film. The type of the electrode connected with second region 133 of center nanowire 131 is not limited, but preferably is a metal film, an alloy film or a metal multilayer film that can make ohmic contact with second region 133. Examples of the metal film that can make ohmic contact with second region 133 include Mo. Examples of the multilayer metal film that can make ohmic contact with second region 133 include a Ti/Au multilayer film, an Ni/Ge/Au multilayer film, a Ge/Au/Ni/Au multilayer film, a Ti/Pt/Au multilayer film and a Ti/Pd/Au multilayer film. In the present embodiment, source electrode 140 is a Ti/Au multilayer film formed on substrate 110, and drain electrode 150 is a Ge/Au/Ni/Au multilayer film or a Ti/Au multilayer film disposed on core-multishell nanowire 130 and isolation protective film 180.

Gate insulating film 160 covers the side surface (all surfaces except for both end surfaces) of core-multishell nanowire 130. The material of gate insulating film 160 is not limited as long as it is an insulator, but preferably is a dielectric having a high dielectric constant. Examples of the material of gate insulating film 160 include silicon oxide ($SiO_2$), aluminum oxide ($Al_2O_3$), hafnium aluminate (HfA-$lO_x$), zirconium oxide ($ZrO_2$) and lanthanum oxide ($La_2O_3$). For example, gate insulating film 160 is a hafnium aluminate film having a film thickness of 14 nm.

Gate electrode 170 is disposed on gate insulating film 160 so as to cover the periphery of first region 132 of core-multishell nanowire 130. In the present embodiment, gate electrode 170 is disposed on gate insulating film 160. Gate electrode 170 operates such that an electric field acts on the channel (first region 132 of center nanowire 131) to simultaneously generate tunneling and two-dimensional electron gas. To be more specific, gate electrode 170 operates such that an electric field acts on the junction interface between the (111) surface of substrate 110 and center nanowire 131, and first region 132 of center nanowire 131. Gate electrode 170 operates such that an electric field acts on the junction interface between substrate 110 and center nanowire 131 to thereby cause tunneling at the junction interface. Simultaneously, gate electrode 170 operates such that an electric field acts on first region 132 of center nanowire 131 to thereby generate two-dimensional electron gas at an outer periphery portion of center nanowire 131. Preferably, regarding the positional relationship between the upper end of gate electrode 170 and the boundary between first region 132 and second region 133 of center nanowire 131, the upper end of gate electrode 170 is located at a position (a position on substrate 110 side) lower than the boundary between first region 132 and second region 133 as illustrated in the schematic view of FIG. 2, but the present invention is not limited to this.

The type of gate electrode 170 is not limited as long as it has conductivity, and is, for example, a metal film, a metal multilayer film, a metal compound film or other conductive films. Examples of the metal of the metal film include W, Ti, Pt, Au and Mo. Examples of the metal multilayer film include a Ti/Au multilayer film. Examples of the metal compound film include a tantalum nitride (TaN) film and a tungsten nitride (WN) film. In the present embodiment, gate electrode 170 is a Ti/Au multilayer film formed on gate insulating film 160.

Isolation protective film 180 is a film made of insulating resin that covers core-multishell nanowire 130, gate insulating film 160 and gate electrode 170.

Preferably, in tunnel-field-effect transistor 100 according to the present embodiment, the junction interface between the (111) surface of substrate 110 made of a group IV semiconductor and center nanowire 131 made of a group III-V compound semiconductor is dislocation-free and defect-free, but may include a few dislocations or defects. To be more specific, it suffices that the cycle of the misfit dislocation at the junction interface is longer than the cycle of the misfit dislocation calculated from the lattice mismatch between the group IV semiconductor of substrate 110 and the group III-V compound semiconductor of center nanowire 131. In addition, it suffices that the density of the threading dislocation at the junction interface falls within a range of 0 to $10^{10}$ dislocations/$cm^2$. By forming center nanowire 131 by the manufacturing method described later, it is possible to manufacture tunnel-field-effect transistor 100 of the present embodiment including the junction interface that is basically dislocation-free and defect-free.

In tunnel-field-effect transistor 100 according to the present embodiment, the junction interface between the (111) surface of substrate 110 made of a group IV semiconductor and center nanowire 131 made of a group III-V compound semiconductor functions as a tunnel layer. For example, in the case where substrate 110 functions as the source region, when a positive voltage is applied to gate electrode 170, the carrier in the source region (substrate 110) moves into the channel region (first region 132 of center nanowire 131) by tunneling (ON state is established). On the other hand, in the case where second region 133 of center nanowire 131 functions as the source region, the carrier in the channel region (the first region of the center nanowire) moves into the drain region (substrate 110) by tunneling (ON state is established). This operation corresponds to a switch operation of an n-type or p-type MOSFET of a CMOS switch. Since the height of an energy barrier of the junction interface varies depending on the type of the group III-V compound semiconductor of center nanowire 131, a supply voltage necessary for an ON state can be arbitrarily controlled by changing the type of the group III-V compound semiconductor.

In addition, in tunnel-field-effect transistor 100 according to the present embodiment, when a positive voltage is applied to gate electrode 170, two-dimensional electron gas having a high mobility is generated at the outer periphery portion of the channel region (first region 132 of center nanowire 131), and the carrier in the source region (substrate 110 or second region 133 of center nanowire 131) moves to the drain region (second region 133 of center nanowire 131 or substrate 110) through the two-dimensional electron gas in the channel region (first region 132 of center nanowire 131) (ON state is established). That is, tunnel-field-effect transistor 100 according to the present embodiment operates not only as a tunnel-field-effect transistor (TFET) but also as a high-electron-mobility transistor (HEMT). Accordingly, tunnel-field-effect transistor 100 of the present embodiment can achieve a current value greater than that of a conventional tunnel-field-effect transistor.

Figure 4:
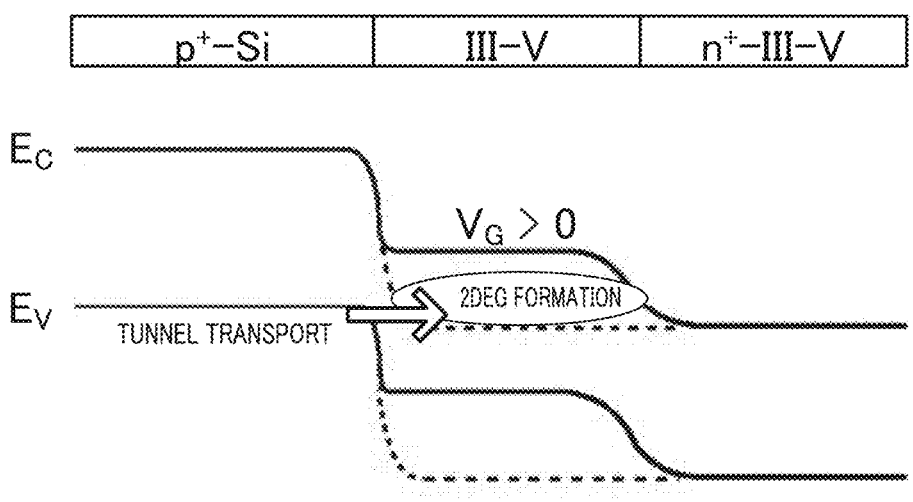
FIG. 4 is a schematic view of a band structure of the tunnel-field-effect transistor illustrated in FIG. 2.
Figure 5:
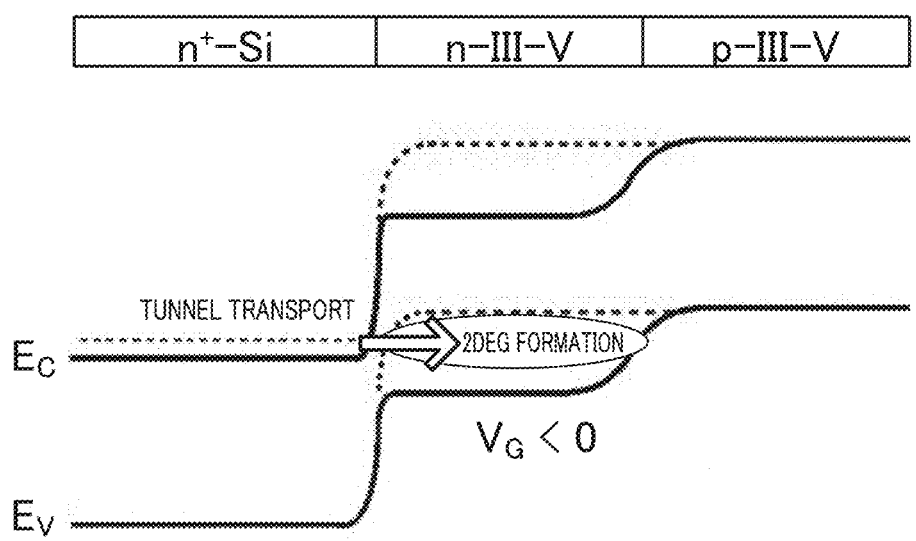
FIG. 5 is a schematic view of the band structure of the tunnel-field-effect transistor illustrated in FIG. 2.

FIG. 4 is a schematic view of a band structure of tunnel-field-effect transistor 100 in the case where substrate 110 is a p-type silicon (111) substrate and second region 133 of center nanowire 131 is n-doped. FIG. 5 is a schematic view of a band structure of tunnel-field-effect transistor 100 in the case where substrate 110 is an n-type silicon (111) substrate and second region 133 of center nanowire 131 is p-doped. As illustrated in these drawings, in tunnel-field-effect transistor 100 according to the present embodiment, when a positive voltage is applied to gate electrode 170, the carrier in substrate 110 moves into center nanowire 131 by tunneling, and the carrier moved into in center nanowire 131 moves at a high speed in the two-dimensional electron gas (ON state is established). As described above, tunnel-field-effect transistor 100 according to the present embodiment simultaneously achieves switching by the two-dimensional electron gas and tunnel transport, and thus can achieve both a small subthreshold coefficient (60 mV/decade or smaller) and increase of the current value (see Example).

By using tunnel-field-effect transistor 100 according to the present embodiment as a switch element, the power consumption of semiconductor device can be reduced. As a result, both power saving and reduction of environmental load can be achieved.

2. Method of Manufacturing Tunnel-Field-Effect Transistor

Next, a method of manufacturing tunnel-field-effect transistor 100 according to the present embodiment is described. FIGS. 6A to 6C and FIGS. 7A and 7B are schematic cross-sectional views illustrating an example of the method of manufacturing tunnel-field-effect transistor 100 according to the present embodiment. As illustrated in the drawings, tunnel-field-effect transistor 100 according to the present embodiment is manufactured through: a first step (1) of preparing substrate 110 (FIG. 6A), a second step (2) of forming core-multishell nanowire 130 (FIGS. 6B and 6C), a third step (3) of forming gate electrode 170 (FIG. 7A), and a fourth step (4) of forming source electrode 140 and drain electrode 150 (FIG. 7B), for example. Each step is described below.

(1) Preparation of Substrate

Figure 6A:
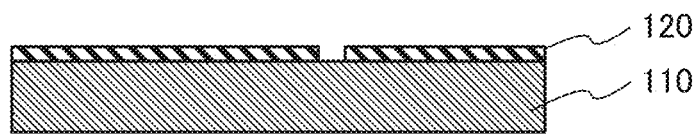
FIGS. 6A to 6C are schematic cross-sectional views illustrating an example of a method of manufacturing the tunnel-field-effect transistor illustrated in FIG. 2.

In the first step, substrate 110 covered with insulating film 120 having an opening is prepared (FIG. 6A). The type of substrate 110 is not limited as long as substrate 110 is a substrate made of a group IV semiconductor having a (111) surface. Substrate 110 is doped to be a first conductivity type (n-doped or p-doped). For example, substrate 110 is an n-type silicon (111) substrate or a p-type silicon (111) substrate. In the case where substrate 110 is a substrate including no (111) surface (silicon (100) substrate or the like), the (111) surface is exposed by anisotropic etching and the like.

The material of insulating film 120 is not limited as long as it is an inorganic insulating material. Examples of the inorganic insulating material include silicon oxide, silicon nitride or the like. The thickness of insulating film 120 for covering the (111) surface is not limited, and it suffices that the thickness of insulating film 120 for covering the (111) surface is approximately 20 nm, for example. The silicon oxide film is formed by, for example, thermally oxidizing the silicon substrate. Naturally, insulating film 120 may be formed by a common thin film formation method such as sputtering.

One or more openings for growing center nanowire 131 are formed in insulating film 120. The opening can be formed using a fine patterning technique such as electron beam lithography, photolithography, nanoimprint lithography or the like. The (111) surface of substrate 110 is exposed to the outside through the opening. The shape of the opening is not limited and can be arbitrarily determined. Examples of the shape of the opening include triangular, rectangular, hexagonal and circular. It suffices that the diameter of the circumcircle of the opening is approximately 2 to 100 nm, for example. In the case where the size of the opening is excessively large, many dislocations or defects might be formed at the junction interface between the (111) surface of substrate 110 and center nanowire 131. When a plurality of openings are periodically arrayed on one substrate 110, it suffices that the interval of openings is approximately 10 nanometers to several micrometers.

Normally, a natural oxide film is formed on the surface of substrate 110. Since this natural oxide film inhibits the growth of center nanowire 131, it is preferable to remove the natural oxide film. Therefore, it is preferable that, after providing the opening on insulating film 120 covering the (111) surface of substrate 110, the natural oxide film formed on the (111) surface exposed inside the opening be removed by applying a high-temperature heat treatment thereto. It suffices that the high-temperature heat treatment is performed under a condition of approximately 900° C. in an atmosphere of inert gas such as hydrogen gas, nitrogen gas or argon gas. By performing the high-temperature heat treatment in the above-mentioned manner, the natural oxide film covering the (111) surface exposed through the opening is removed and oxygen atoms are removed from the crystal structure at the interface between the group IV semiconductor and the natural oxide film. At locations where oxygen atoms are removed, group III atoms or group V atoms are adsorbed instead of oxygen atoms (which will be described later).

Figure 8:
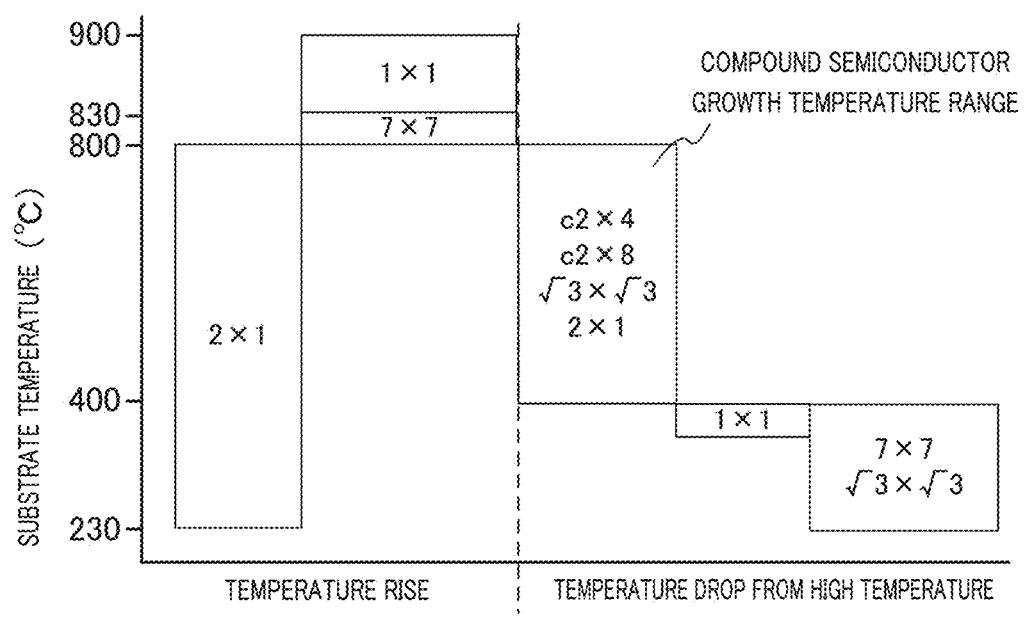
FIG. 8 is a classification table of a surface reconstruction structure (a phenomenon in which the atomic arrangement of surface atoms changes) of a silicon surface in the case where the substrate temperature is raised and the case where the substrate temperature is reduced from a high temperature.
Figure 9A:
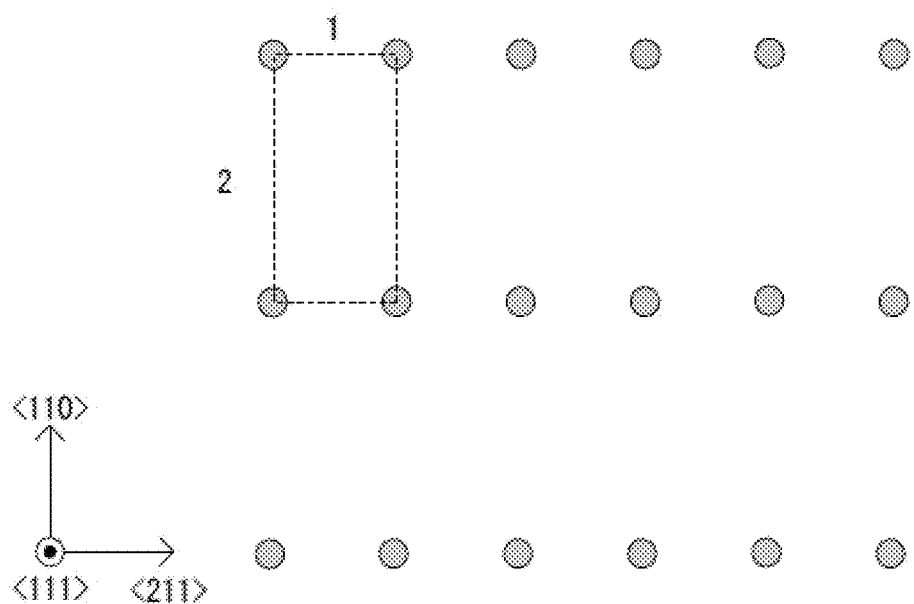
FIG. 9A is a schematic view illustrating a (111) surface.
Figure 9B:
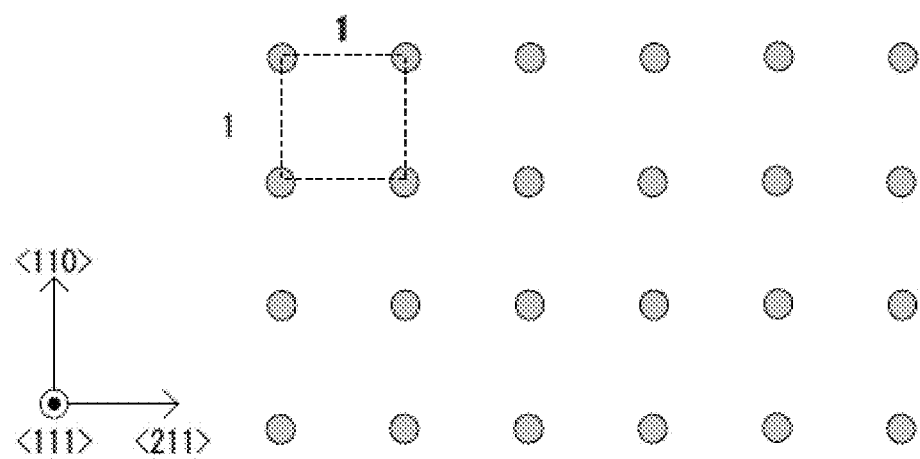
FIG. 9B is a schematic view illustrating a (111)1×1 surface.

The (111) surface subjected to the high-temperature heat treatment has a 1×1 structure. However, if the temperature of substrate 110 is lowered as it is, an irregular atomic arrangement on the surface of substrate 110 results as shown in the classification table (compound semiconductor growth temperature range) of FIG. 8. However, when the temperature is further lowered to approximately 400° C., the surface of substrate 110 is recovered to the 1×1 structure. In view of this, in the manufacturing method of the present embodiment, the temperature of substrate 110 is lowered to a low temperature (approximately 400° C.) after the high-temperature heat treatment. Here, the "low temperature" is a temperature lower than a temperature required for growing center nanowire 131. By lowering the temperature of substrate 110 in this manner, it is possible to convert the (111)2×1 surface of substrate 110 to a (111)1×1 surface. The "(111)2×1 surface" is a surface where the minimum unit of the atomic arrangement is 2-atom distance×1-atom distance as shown in FIG. 9A. On the other hand, the "(111)1×1 surface" is a surface where the minimum unit of the atomic arrangement is 1-atom distance×1-atom distance as shown in FIG. 9B.

As will be described later, the (111)1×1 surface of substrate 110 is converted to a (111)A surface or a (111)B surface by group III elements or group V elements. Here, "(111)A surface" is a structure in which group V atoms are attached to group IV atoms in the outermost surface, or a structure in which group IV atoms in the outermost surface are substituted by group III atoms. In addition, "(111)B surface" is a structure in which group III atoms are attached to group IV atoms in the outermost surface, or a structure in which group IV atoms in the outermost surface are substituted by group V atoms.

By converting the (111)1×1 surface of substrate 110 to a (111)A surface or a (111)B surface, the growth of the group III-V compound semiconductor from the surface can be facilitated. The (111)A surface or the (111)B surface of the group III-V compound semiconductor has a structure in which a (111)2×2 surface, that is, the minimum unit, is configured at a cycle of 2-atom distance×2-atom distance. In view of this, when group III elements or group V elements are arranged in a minimum unit smaller than the 2-atom distance×2-atom distance on the surface of the group IV semiconductor substrate, the group III-V compound semiconductor can easily grow on the surface.

On the other hand, it is reported that a stable structure of the (111) surface that can be easily generated by applying heat treatment to a silicon substrate is a (111)7×7 surface (Surf. Sci. Vol. 164, (1985), p. 367-392). Conversion of a (111)7×7 surface to a (111)A surface or a (111)B surface results in an arrangement cycle whose minimum unit is 7-atom distance×7-atom distance. This minimum unit is greater than the minimum unit of the arrangement cycle of a crystal structure of a group III-V compound semiconductor. Consequently, a group III-V compound semiconductor is not easily grown on the surface.

It suffices that a low-temperature heat treatment for converting the (111)2×1 surface of substrate 110 to the (111)1×1 surface is performed at a temperature of approximately 350 to 450° C. (e.g., approximately 400° C.). Preferably, the low-temperature heat treatment is performed in an atmosphere of inert gas such as hydrogen gas, nitrogen gas, argon gas, and helium gas.

The (111)2×1 surface of substrate 110 is converted to a (111)1×1 surface by the low-temperature heat treatment, and is converted to a (111)A surface or a (111)B surface by supplying a group III raw material or a group V raw material to the surface of substrate 110. Preferably, the group III raw material is a gas containing boron, aluminum, gallium, indium or titanium (or, an organic metal compound may also be adopted). The group III raw material is an organic alkyl metal compound such as trimethylindium. Preferably, the group V raw material is a gas containing nitrogen, phosphor, arsenic, antimony or bismuth (or, an organic metal compound may also be adopted). The group V raw material is, for example, hydrogenated arsenic (arsine; $AsH_3$). Preferably, the group III raw material or the group V raw material is supplied at 400 to 500° C.

The step of converting the surface of substrate 110 to a (111)A surface or a (111)B surface may be performed after the step of converting the surface of substrate 110 to a (111)1×1 surface or may be performed simultaneously with the step of converting it to a (111)1×1 surface. That is, the surface of substrate 110 may be converted to a (111)A surface or a (111)B surface by supplying the group III raw material or the group V raw material while converting the (111) surface of substrate 110 to a (111)1×1 surface through a low-temperature heat treatment at approximately 400° C.

As described above, oxygen atoms are removed from the (111) surface when the natural oxide film is removed by applying heat treatment to substrate 110 at a high temperature (e.g., 900° C.). When a (111)1×1 surface is obtained in the state where oxygen atoms are removed, a portion where the bonding between group IV elements is cut off is formed. As shown in FIG. 8, the (111) surface after a high-temperature heat treatment is has a 1×1 structure and when the temperature is lowered in this state, an atomic arrangement including various irregular cycles is formed on the surface. When the temperature is further lowered to approximately 400° C., the (111) surface is recovered to the 1×1 structure. The recovered 1×1 structure is thermodynamically unstable, and when group III elements or group V elements are supplied in this state, the group III elements or the group V elements form a (111)A surface or a (111)B surface in such a manner that the group III atoms or the group V atoms are adsorbed to the surface so as to replace the group IV atoms (e.g., silicon atoms) on the outermost surface. Thus, the (111)A surface or the (111)B surface is relatively easily obtained.

(2) Production of Core-Multishell Nanowire

Figure 6B:
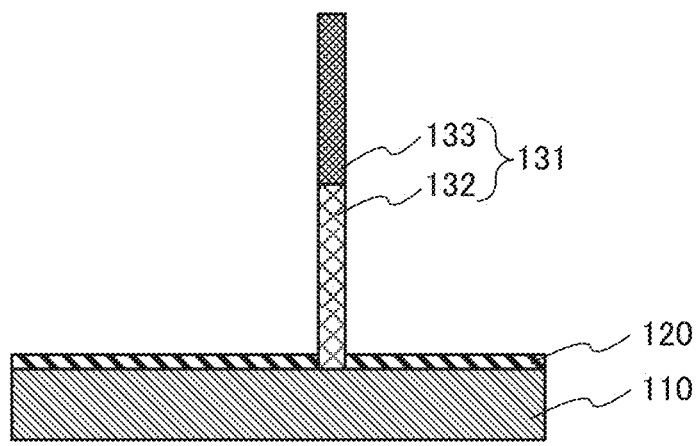
Figure 6C:
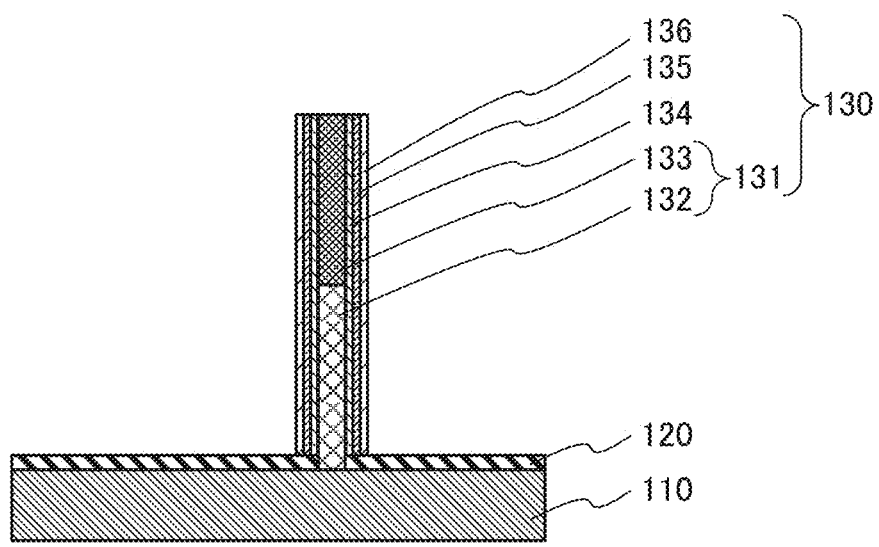

In the second step, core-multishell nanowire 130 is formed (FIGS. 6B and 6C). To be more specific, center nanowire 131 is grown from the (111) surface of substrate 110 exposed in the opening of insulating film 120 (FIG. 6B), and then a plurality of cover layers are formed on the side surface of center nanowire 131 (FIG. 6C). At this time, it is preferable to form a thin film of a group III-V compound semiconductor on the (111) surface of substrate 110 by an alternate-raw material supply modulation method before growing center nanowire 131.

(Alternate-Raw Material Supply Modulation Method)

A raw-material gas containing group III elements and a raw-material gas containing group V elements are alternately supplied to substrate 110 (hereinafter referred to as "alternate-raw material supply modulation method") and a thin film of the group III-V compound semiconductor is formed on the (111)A surface or the (111)B surface exposed inside the opening of insulating film 120. Preferably, the thin film is formed by the alternate-raw material supply modulation method at a temperature lower than a temperature required for growing center nanowire 131. For example, it suffices that formation of the thin film by the alternate-raw material supply modulation method is performed at approximately 400° C., or is performed while raising the temperature from 400° C.

To be more specific, in the case where the (111)A surface is formed on substrate 110, the raw-material gas containing the group III elements is supplied first and then the raw-material gas containing the group V elements is supplied. Further, the raw-material gas containing the group III elements and the raw-material gas containing the group V elements are alternately and repeatedly supplied. On the other hand, in the case where the (111)B surface is formed on substrate 110, the raw-material gas containing the group V elements is supplied first and then the raw-material gas containing the group III elements is supplied. Further, the raw-material gas containing the group V elements and the raw-material gas containing the group III elements are alternately and repeatedly supplied.

It suffices that each of the supply time for the raw-material gas containing the group V elements and the supply time for the raw-material gas containing the group III elements is several seconds. In addition, it is preferable to provide an interval of several seconds between the supply of the raw-material gas containing the group V elements and the supply of the raw-material gas containing the group III elements. It suffices that the raw-material gas containing the group V elements and the raw-material gas containing the group III elements are alternately supplied until the thin film of the group III-V compound semiconductor has a desired thickness. The thin film of the group III-V compound semiconductor is formed by repeating the supply of the gas several times.

This alternate-raw material supply modulation method also provides a compensation effect of re-forming the (111)A surface or the (111)B surface even when there is a portion that is failed to be converted at the time of conversion of the (111)1×1 surface of substrate 110 to a (111)A surface or a (111)B surface. This is because the group IV elements and group III elements or group V elements are bonded together by the alternate-raw material supply modulation method.

Thereafter, the substrate temperature is raised to grow center nanowire 131, and the thin film of the group III-V compound semiconductor formed using the alternate-raw material supply modulation method prevents dissociation of the group III elements and/or group IV elements adsorbed to the substrate.

(Formation of Center Nanowire)

After forming the thin film of the group III-V compound semiconductor, center nanowire 131 made of a group III-V compound semiconductor is grown from the (111) surface of substrate 110 through the opening of insulating film 120 (FIG. 6B). Center nanowire 131 is grown by, for example, a metal-organic chemical vapor phase epitaxy method (hereinafter also referred to as "MOVPE method"), a molecular-beam epitaxy method (hereinafter also referred to as "MBE method") and the like. Preferably, center nanowire 131 is grown by a MOVPE method. It is to be noted that, in regions other than the opening of insulating film 120, the growth of center nanowire 131 is inhibited by insulating film 120.

Center nanowire 131 can be formed by a MOVPE method using a normal MOVPE apparatus. That is, it suffices that a raw-material gas containing the group III elements and a raw-material gas containing the group V elements are provided at a predetermined temperature and under a reduced pressure condition. For example, when an InAs nanowire is formed, it suffices that a gas containing arsenic hydride and trimethylindium is provided at approximately 540° C. In addition, when a GaAs nanowire is formed, it suffices that a gas containing hydrogenated arsenic and trimethylgallium is provided at approximately 750° C. When forming an InGaAs nanowire, it suffices that a gas containing hydrogenated arsenic, trimethylgallium and trimethylindium is provided at approximately 670° C.

Through the above procedure, center nanowire 131 made of a group III-V compound semiconductor can be formed on the (111) surface of the group IV semiconductor substrate such that the longitudinal axis thereof is perpendicular to the (111) surface. Basically, the junction interface between the (111) surface of substrate 110 and center nanowire 131 formed in the above-mentioned manner are dislocation-free and defect-free.

At least second region 133 of the formed center nanowire 131 is doped to be the second conductivity type (p-doped or n-doped) different from the type of substrate 110. For example, center nanowire 131 can be doped with a p-type dopant or an n-type dopant by supplying a doping gas or a doping organic metal while forming the group III-V compound semiconductor nanowire by an MOVPE method. In the case of p-dope, the type of the doping gas and the doping organic metal is not limited as long as C, Zn or Te is contained therein, whereas in the case of n-dope, the type of the doping gas and the doping organic metal is not limited as long as C, Si, Ge, Sn, O, S, Se or Te is contained therein. For example, the p-type group III-V compound semiconductor nanowire that serves as second region 133 can be formed by simultaneously supplying a gas containing group VI atoms or the organic metal material and the material of center nanowire 131 after first region 132 of center nanowire 131 is formed. Likewise, the n-type group III-V compound semiconductor nanowire that serves as second region 133 can be formed by simultaneously supplying a gas containing group IV atoms or the organic metal material and the material of center nanowire 131 after first region 132 of center nanowire 131 is formed by a MOVPE method. Alternatively, second region 133 can be set to p-type by implanting ions of group VI atoms to the portion that serves as second region 133 of center nanowire 131. Likewise, second region 133 can be set to n-type by implanting ions of group IV atoms by ion implantation to the portion that serves as second region 133 of center nanowire 131.

In tunnel-field-effect transistor 100 according to the present embodiment, the turn-on voltage in the tunnel-field-effect-transistor (TFET) structure and the threshold voltage in the high-electron-mobility-transistor (HEMT) structure are required to be equal to each other. In view of this, the impurity concentration of first region 132 of center nanowire 131 is controlled to adjust the turn-on voltage in the TFET structure to a value equal to the threshold voltage in the HEMT structure. For example, the turn-on voltage in the TFET structure can be shifted by intermittently doping (pulse doping) a dopant of the first conductivity type while forming first region 132 of center nanowire 131 (WO2015/022777). In this case, the concentration of the dopant of the first conductivity type in first region 132 is lower than the concentration of the dopant of the second conductivity type in first region 132. The turn-on voltage in the TFET structure can be adjusted by controlling the impurity concentration of first region 132 by pulse doping in the above-mentioned manner.

(Formation of Cover Layer)

After center nanowire 131 is formed, the cover layers are formed on the side surface of center nanowire 131 (FIG. 6C). To be more specific, barrier layer 134 is formed on the side surface of center nanowire 131, and then modulation dope layer 135 and cap layer 136 (or, first spacer layer 137, modulation dope layer 135, second spacer layer 138 and cap layer 136) in this order are stacked on barrier layer 134. The cover layers are formed by, for example, a metal-organic chemical vapor phase epitaxy method (hereinafter also referred to as "MOVPE method"), a molecular-beam epitaxy method (hereinafter also referred to as "MBE method") and the like. Preferably, the method of forming the cover layers is identical to the method of manufacturing center nanowire 131 in view of reducing the operation processes.

To form the cover layers on the side surface of center nanowire 131, it is preferable to facilitate the growth in the radial direction than the longitudinal direction of center nanowire 131. The growth in the radial direction can be facilitated by reducing the temperature of substrate 110 by approximately 50 to 200° C. from the temperature at which center nanowire 131 has been grown. In this manner, the growth speed on the side surface of center nanowire 131 becomes greater than the growth speed in the longitudinal direction of center nanowire 131, and the lateral growth for forming the cover layers on the side surface of center nanowire 131 can be achieved. The vertical growth may not be completely inhibited. In the case where the cover layers have been formed so as to cover the upper end surface of center nanowire 131, it suffices to expose the end surfaces of center nanowire 131 and the cover layers by mechanical polishing and the like.

Barrier layer 134, (first spacer layer 137), modulation dope layer 135, (second spacer layer 138) and cap layer 136 can be sequentially formed by changing the types of the supply raw-material gases in the formation process of the cover layers. For example, the cover layers of a structure (see FIG. 3A) in which InP (barrier layer 134), δ-doping InAlAs (modulation dope layer 135) and InGaAs (cap layer 136) in this order are stacked in the radial direction from center nanowire 131 made of InGaAs can be formed by: growing InP (barrier layer 134) at 580° C. by supplying trimethylindium gas and tert-butylphosphine gas; then growing InAlAs (modulation dope layer 135) at 580° C. by supplying trimethylindium gas, trimethylaluminum gas, arsenic hydride gas and monosilane gas; and then growing InGaAs (cap layer 136) at 580° C. by supplying trimethylindium gas, trimethylgallium gas and arsenic hydride gas. In addition, the cover layers of a structure (see FIG. 3B) in which InP (barrier layer 134), InAlAs (first spacer layer 137), δ-doping InAlAs (modulation dope layer 135), InAlAs (second spacer layer 138), and InGaAs (cap layer 136) in this order are stacked in the radial direction from center nanowire 131 made of InGaAs can be formed by: growing InP (barrier layer 134) at 580° C. by supplying trimethylindium gas and tert-butylphosphine gas; then growing InAlAs (first spacer layer 137) at 580° C. by supplying trimethylindium gas, trimethylaluminum gas and arsenic hydride gas; then growing InAlAs (modulation dope layer 135) at 580° C. by supplying trimethylindium gas, trimethylaluminum gas, arsenic hydride gas and monosilane gas; then growing InAlAs (second spacer layer 138) at 580° C. by supplying trimethylindium gas, trimethylaluminum gas and arsenic hydride gas; and then growing InGaAs (cap layer 136) at 580° C. by supplying trimethylindium gas, trimethylgallium gas and arsenic hydride gas.

Modulation dope layer 135 is doped to be the second conductivity type (n-doped or p-doped). Barrier layer 134 and cap layer 136 may be or may not be doped to be the second conductivity type (p-doped or n-doped). First spacer layer 137 and second spacer layer 138 may be or may not be doped to be the first conductivity type (n-doped or p-doped) or the second conductivity type (p-doped or n-doped). The cover layer of n-type can be formed by simultaneously supplying an organic metal material and the material of the cover layer or a gas containing group IV atoms by a MOVPE method. Likewise, the cover layer of p-type can be formed by simultaneously supplying an organic metal material and the material of the cover layer or a gas containing group VI atoms. In the case of n-dope, the types of the doping gas and the doping organic metal is not limited as long as C, Si, Ge, Sn, O, S, Se or Te is contained, whereas in the case of p-dope, the types of the doping gas and the doping organic metal is not limited as long as C, Zn or Te is contained. The concentration of the carrier is not limited, and it suffices that the concentration of the carrier is approximately $1\times10^{16}$ to $5\times10^{20}$ cm$^{-3}$.

(3) Formation of Gate Electrode

Figure 7A:
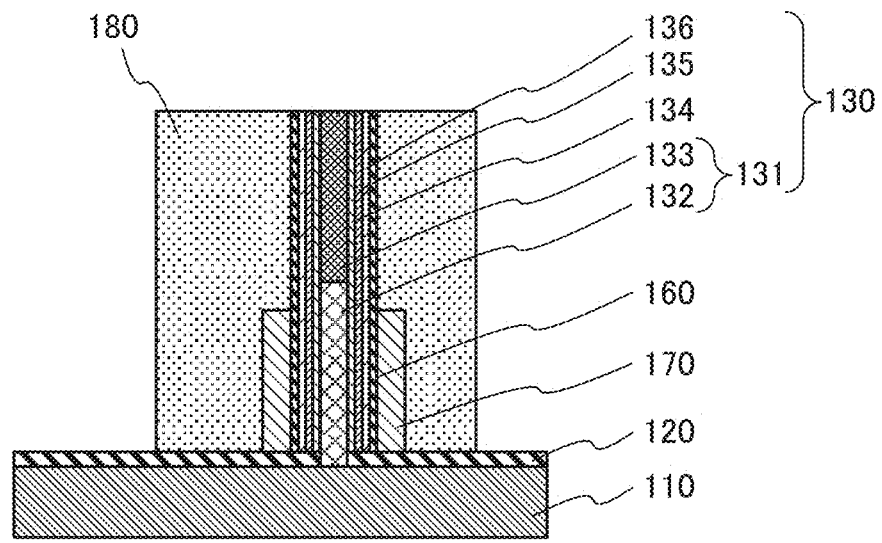
FIGS. 7A and 7B are schematic cross-sectional views illustrating an example of a method of manufacturing the tunnel-field-effect transistor illustrated in FIG. 2.

In the third step, gate electrode 170 is formed (FIG. 7A). To be more specific, gate insulating film 160 is formed on the side surface of center nanowire 131, and gate electrode 170 is formed on gate insulating film 160. The method of forming gate insulating film 160 is not limited. For example, it suffices that a film made of silicon oxide ($SiO_2$), aluminum oxide ($Al_2O_3$), hafnium oxide ($HfO_2$), zirconium oxide ($ZrO_2$) or lanthanum oxide ($La_2O_3$) is formed by an ALD method and the like. Also, the method of forming gate electrode 160 is not limited. For example, it suffices that the electrode is formed by: masking a region other than a portion in which to form an electrode with a resist film by a photolithography method; then vapor-depositing a metal such as gold, platinum, titanium, chromium, aluminum, palladium, molybdenum or a semiconductor such as polysilicon; and then removing the resist film (liftoff). In addition, after the deposition of titanium, gold may be further deposited and stacked to form an electrode of a two-layer structure. Isolation protective film 180 that protects core-multishell nanowire 130, gate insulating film 160 and gate electrode 170 may be formed after gate electrode 170 is formed. Isolation protective film 180 is a film made of an insulating resin, for example.

(4) Formation of Source Electrode and Drain Electrode

Figure 7B:
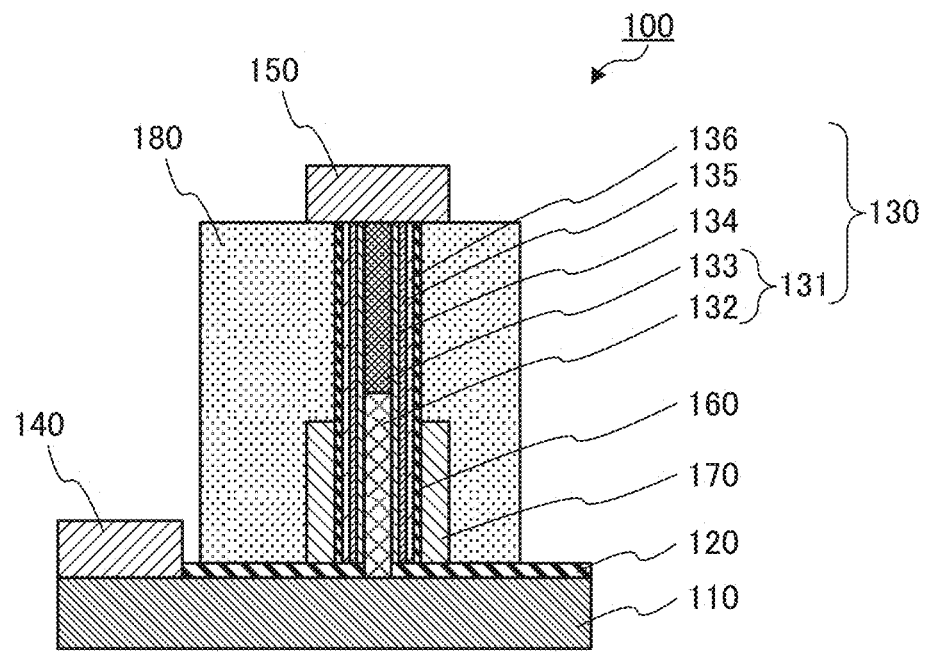

In the fourth step, source electrode 140 and drain electrode 150 are formed (FIG. 7B). The method of forming source electrode 140 and drain electrode 150 is not limited. For example, it suffices to form source electrode 140 and drain electrode 150 by a photolithography method, as with gate electrode 170.

Through the above-mentioned procedure, tunnel-field-effect transistor 100 according to the present embodiment can be manufactured.

With the method of manufacturing tunnel-field-effect transistor 100 according to the present embodiment, it is possible to form a high-quality crystal structure device without being influenced by metal contamination since core-multishell nanowire 130 is formed without using a metal catalyst. In addition, with the method of manufacturing tunnel-field-effect transistor 100 according to the present embodiment, it is possible to manufacture a tunnel-field-effect transistor having a desired characteristic without using any precise doping technique by appropriately selecting the type of the group IV semiconductor and group III-V compound semiconductor. Further, with the method of manufacturing tunnel-field-effect transistor 100 according to the present embodiment, when center nanowire 131 made of a mixed crystal semiconductor such as InGaAs is formed, only changing the In composition causes band discontinuities at the junction interface to demonstrate opposite characteristics. Therefore, by using the characteristics, tunnel-field-effect transistor 100 that demonstrates different switch characteristics can be manufactured by growing center nanowire 131 made of a group III-V compound semiconductor only once.

While the field effect transistor including the substrate made of a group IV semiconductor and the core-multishell nanowire made of a group III-V compound semiconductor has been described as an example of the tunnel-field-effect transistor according to the embodiment of the present invention, the tunnel-field-effect transistor according to the embodiment of the present invention is not limited to this. As described above, the tunnel-field-effect transistor according to the embodiment of the present invention may have a structure of a FinFET, an HEMT having a surrounding gate structure, and the like as long as the tunnel-field-effect transistor has both the tunnel-field-effect-transistor (TFET) structure and the high-electron-mobility-transistor (HEMT) structure. The tunnel-field-effect transistor according to the embodiment of the present invention can be used in place of commercially available HEMTs such as an HEMT for communication, an AlGaN/GaN power HEMT for vehicle, and the like, for example.

EXAMPLES

The present invention is described in detail below with Examples. The present invention is not limited to Examples.
1. Production of Tunnel-Field-Effect Transistor According to the Present Invention
(1) Production of TFET-1 (Example)

A p-type silicon (111) substrate (carrier concentration: $7\times10^{18}$ cm$^{-3}$) was subjected to a thermal oxidation treatment and a silicon oxide film having a film thickness of 20 nm was formed on the surface. Openings are periodically formed in the silicon oxide film by electron lithography and wet chemical etching, and the surface of the silicon substrate was exposed. The shape of the opening was set to a hexagonal shape, and the size of the opening (the diameter of the circumcircle) was set to 30 nm.

The substrate provided with the openings was set in a sub-atmospheric transverse MOVPE apparatus (HR2339; TAIYO NIPPON SANSO CORPORATION). The temperature of the silicon substrate was raised to 925° C., and kept for five minutes to thereby remove a natural oxide film formed on the opening surface of the silicon substrate. Next, the temperature of silicon substrate was lowered to 400° C. from 925° C. Arsenic hydride was supplied together with hydrogen gas (carrier gas). The partial pressure of arsenic hydride was set at $1.3\times10^{-4}$ atm.

Next, a thin film of InGaAs was formed at the opening of the silicon substrate by an alternate-raw material supply modulation method. To be more specific, a cycle including two-second supply of trimethylindium and trimethylgallium, two-second interval using hydrogen gas, one-second supply of hydrogenated arsenic and two-second interval using hydrogen gas was repeated 20 times in two minutes. The partial pressure of trimethylindium was set to $4.7\times10^{-7}$ atm, the partial pressure of trimethylgallium was set to $5.7\times10^{-7}$ atm, and the partial pressure of arsenic hydride was set to $1.3\times10^{-4}$ atm.

Next, after raising the temperature of the silicon substrate, an $In_{0.7}Ga_{0.3}As$ nanowire (center nanowire) having a thickness (the diameter of the circumcircle) of 30 nm and a length of 1.2 μm was grown by a MOVPE method. To be more specific, after the temperature of the silicon substrate was raised to 670° C. from 400° C., trimethylindium, trimethylgallium and arsenic hydride were supplied together with hydrogen gas, and an $In_{0.7}Ga_{0.3}As$ nanowire (first region) having a length of 100 nm was grown. At this time, diethyl zinc was intermittently supplied along with continuous supply of trimethylindium, trimethylgallium and arsenic hydride. In the supply of diethyl zinc, a cycle including one-second supply of diethyl zinc and 29-second interval is repeated 30 times. The partial pressure of trimethylindium was set to $4.7\times10^{-7}$ atm, the partial pressure of trimethylgallium was set to $5.7\times10^{-7}$ atm, the partial pressure of arsenic hydride was set to $1.3\times10^{-4}$ atm, and the partial pressure of diethyl zinc was set to $3.0\times10^{-7}$ atm. The concentration of the dopant (Zn) in the first region was $1\times10^{15}$ cm$^{-3}$. Subsequently, trimethylindium, trimethylgallium, arsenic hydride and monosilane were supplied together with hydrogen gas, and an $In_{0.7}Ga_{0.3}As$ nanowire (second region) of n-type having a length of 1.1 μm was grown. The partial pressure of trimethylindium was set to $4.9\times10^{-7}$ atm, the partial pressure of trimethylgallium was set to $5.7\times10^{-7}$ atm, the partial pressure of arsenic hydride was set to $1.3\times10^{-4}$ atm, and the partial pressure of monosilane was set to $7\times10^{-8}$ atm. The concentration of the dopant (Si) in the second region was $5\times10^{18}$ cm$^{-3}$.

Next, an InP layer (barrier layer), an $In_{0.5}Al_{0.5}As$ layer (first spacer layer), a δ-doping InAlAs layer (modulation dope layer), an $In_{0.5}Al_{0.5}As$ layer (second spacer layer), and an $In_{0.7}Ga_{0.3}As$ layer (cap layer) were formed in this order at the periphery (mainly, the side surface) of the $In_{0.7}Ga_{0.3}As$ nanowire (center nanowire) (see FIG. 3B). To be more specific, the temperature of the silicon substrate was set to 580° C., trimethylindium gas and tert-butylphosphine gas were supplied together with hydrogen gas, and an InP layer (barrier layer) having a film thickness of 5 nm was formed on the side surface of the $In_{0.7}Ga_{0.3}As$ nanowire (center nanowire). Next, trimethylindium gas, trimethylaluminum gas and arsenic hydride gas were supplied together with hydrogen gas, and an $In_{0.5}Al_{0.5}As$ layer (first spacer layer) having a film thickness of 2.5 nm was formed on the InP layer (barrier layer). Next, trimethylindium gas, trimethylaluminum gas, arsenic hydride gas and monosilane gas were supplied together with hydrogen gas, and an δ-doping InAlAs layer (modulation dope layer) having a film thickness of 5 nm was formed on the $In_{0.5}Al_{0.5}As$ layer (first spacer layer). Next, trimethylindium gas, trimethylaluminum gas and arsenic hydride gas were supplied together with hydrogen gas, and an $In_{0.5}Al_{0.5}As$ layer (second spacer layer) having a film thickness of 2.5 nm was formed on the δ-doping InAlAs layer (modulation dope layer). Finally, trimethylindium gas, trimethylgallium gas and arsenic hydride gas were supplied together with hydrogen gas, and an $In_{0.7}Ga_{0.3}As$ layer (cap layer) having a film thickness of 5 nm was formed on the $In_{0.5}Al_{0.5}As$ layer (second spacer layer). The partial pressure of trimethylindium was set to $3.6\times10^{-6}$ atm, the partial pressure of tert-butylphosphine was set to $1.2\times10^{-4}$ atm, the partial pressure of trimethylaluminum was set to $7.5\times10^{-7}$ atm, the partial pressure of arsenic hydride was set to $1.3\times10^{-7}$ atm, the partial pressure of monosilane was set to $1.2\times10^{-7}$ atm, and the partial pressure of trimethylgallium was set to $8.2\times10^{-7}$ atm. The carrier concentration of the δ-doping InAlAs layer (modulation dope layer) was set to $1\times10^{19}$ cm$^{-3}$.

Figure 10:
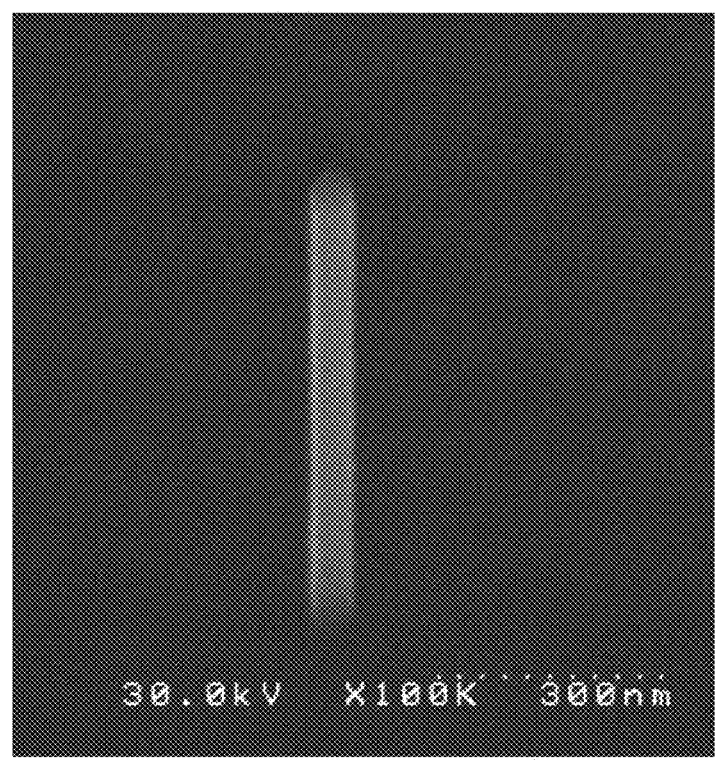
FIG. 10 is a scanning electron microscope photograph of a silicon substrate in which core-multishell nanowires for a TFET-1 are periodically arranged.

Through the above-mentioned steps, a core-multishell nanowire having a thickness (the diameter of the circumcircle) of 70 nm and a length of 1.2 μm was formed on the surface of the silicon substrate. FIG. 10 is a scanning electron microscope photograph (perspective image) of the silicon substrate in which core-multishell nanowires are arranged periodically. As illustrated in FIG. 10, the major axis of the core-multishell nanowire was perpendicular to the surface of the silicon substrate.

A gate insulating film was formed on the side surface of the core-multishell nanowire, and further a gate electrode was formed thereon. To be more specific, an $Hf_{0.8}Al_{0.2}O$ film (gate insulating film) having a film thickness of 14 nm was formed by an ALD method. Thereafter, by a radio frequency sputtering method, a W film (gate electrode) having a film thickness of 100 nm was formed at a portion of the core-multishell nanowire on the silicon substrate side. The length of the gate electrode was 150 nm in the longitudinal axial direction of the core-multishell nanowire.

Next, an insulating resin (BCB resin) film was formed on the silicon substrate and the core-multishell nanowire on the silicon substrate and the like were embedded in the insulating resin. Next, a part of the top side of the insulating resin was removed by reactive ion etching, and the distal end of the $In_{0.7}Ga_{0.3}As$ nanowire (center nanowire) was exposed.

Next, on the surface where the $In_{0.7}Ga_{0.3}As$ nanowire (center nanowire) was exposed, a Ti (20 nm)/Pd (20 nm)/Au (100 nm) multilayer film having a film thickness of 120 nm was formed as a drain electrode. In addition, a Ti (20 nm)/Au (30 nm) multilayer film having a film thickness of 50 nm was formed as a source electrode on the silicon substrate.

Figure 11:
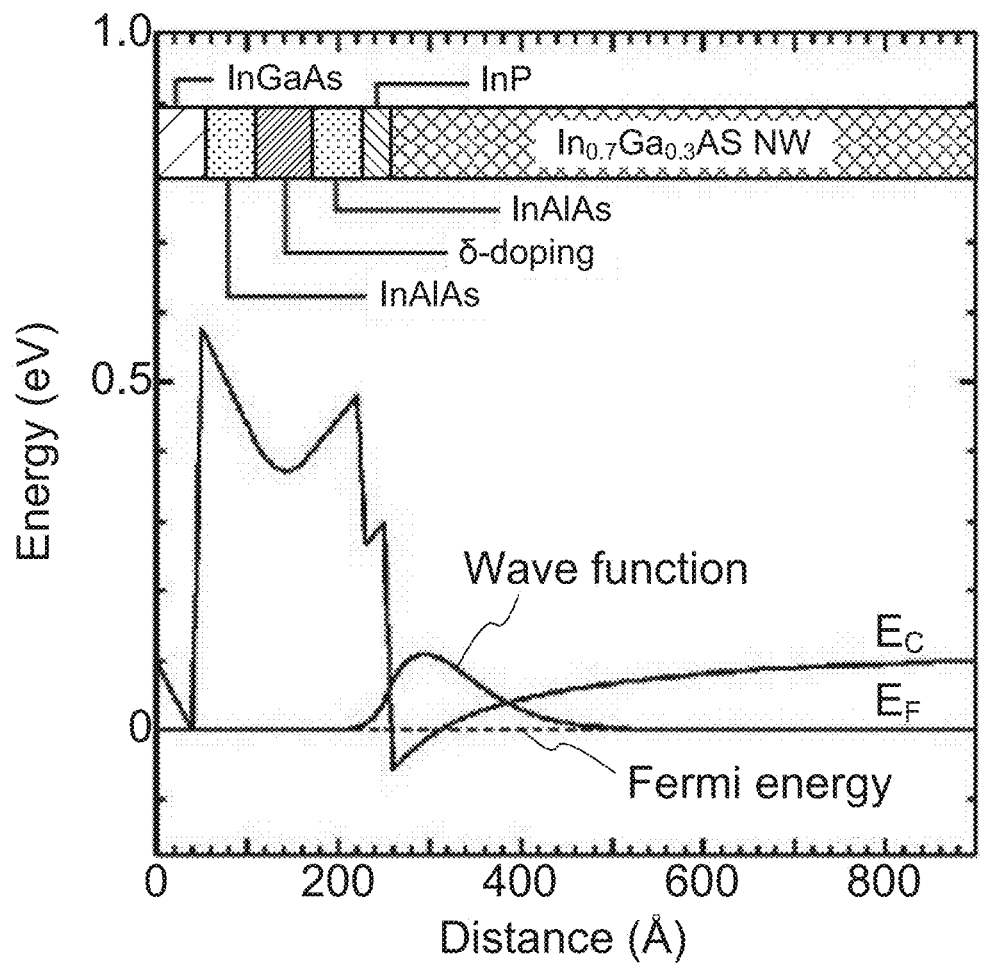
FIG. 11 illustrates a band structure of an HEMT structure included in a TFET-1.

Through the above-mentioned procedure, a TFET-1 was produced as the tunnel-field-effect transistor according to the embodiment of the present invention (see FIGS. 2 and 3B). FIG. 11 illustrates a band of an HEMT structure included in the tunnel-field-effect transistor ($V_G$=0.50 V).

(2) Production of TFET-2 (Comparative Example)

A TFET-2 as a tunnel-field-effect transistor for comparison was produced through a procedure that is identical to that of the TFET-1 except in that the cover layers such as a modulation dope layer were not formed on the side surface of the $In_{0.7}Ga_{0.3}As$ nanowire (center nanowire). The thickness (the diameter of the circumcircle) of the $In_{0.7}Ga_{0.3}As$ nanowire (center nanowire) was 30 nm.

Through the above-mentioned procedure, two tunnel-field-effect transistors, the TFET-1 and the TFET-2, were produced. The TFET-1 has both a tunnel-field-effect-transistor (TFET) structure and a high-electron-mobility-transistor (HEMT) structure. On the other hand, the TFET-2 has the tunnel-field-effect-transistor (TFET) structure, but does not have the high-electron-mobility transistor (HEMT).

3. Evaluations on Electrical Characteristics

The electrical characteristics of the two tunnel-field-effect transistors produced by the above-mentioned steps were measured.

Figure 12:
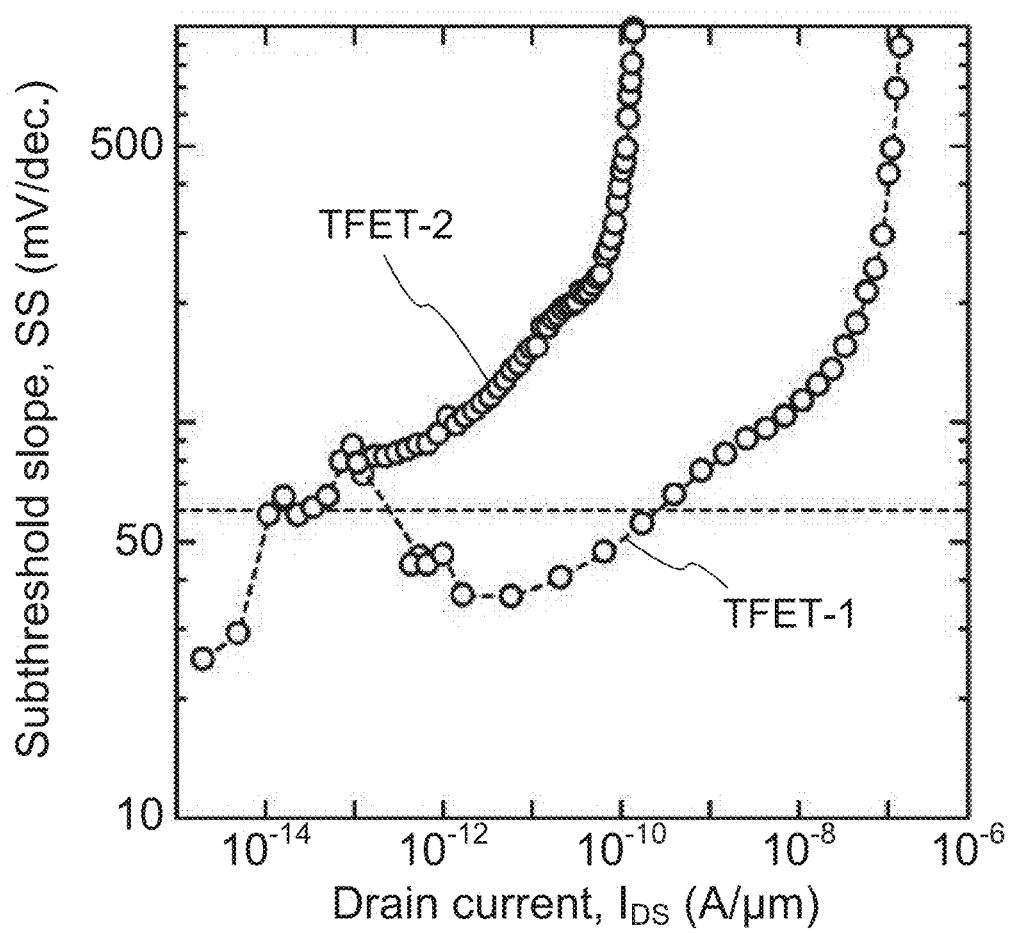
FIG. 12 is a graph illustrating a relationship between a drain current and a subthreshold coefficient in a TFET-1 and a TFET-2.

FIG. 12 is a graph illustrating a relationship between the drain current ($I_{DS}$) and the subthreshold coefficient in the TFET-1 (Example) and the TFET-2 (comparative example). As can be seen in the graph, the subthreshold coefficient of the TFET-1 of the Example was 60 mV/decade or smaller (40 mV/decade). It can be said from this result that the tunnel-field-effect transistor according to the embodiment of the present invention can operate with a small subthreshold coefficient smaller than the theoretical minimum value of 60 mV/decade of the subthreshold coefficient of the MOSFET.

Figure 13A:
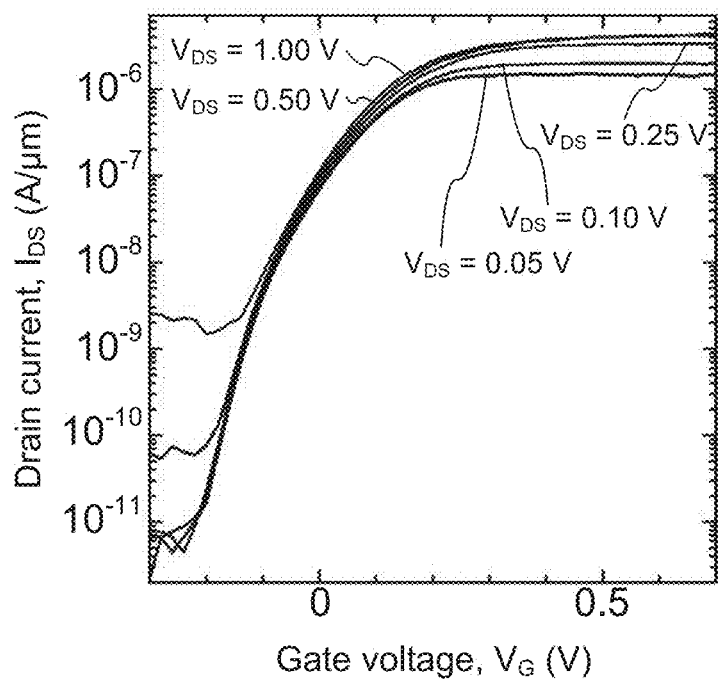
FIG. 13A is a graph illustrating a relationship between a gate voltage and a drain current in a TFET-1.
Figure 13B:
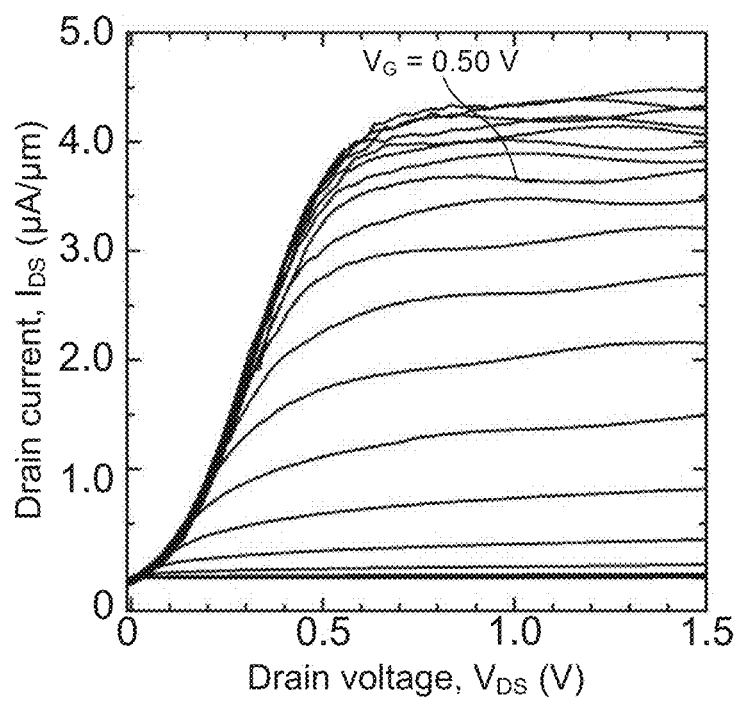
FIG. 13B is a graph illustrating a relationship between a drain voltage and a drain current in a TFET-1.
Figure 14A:
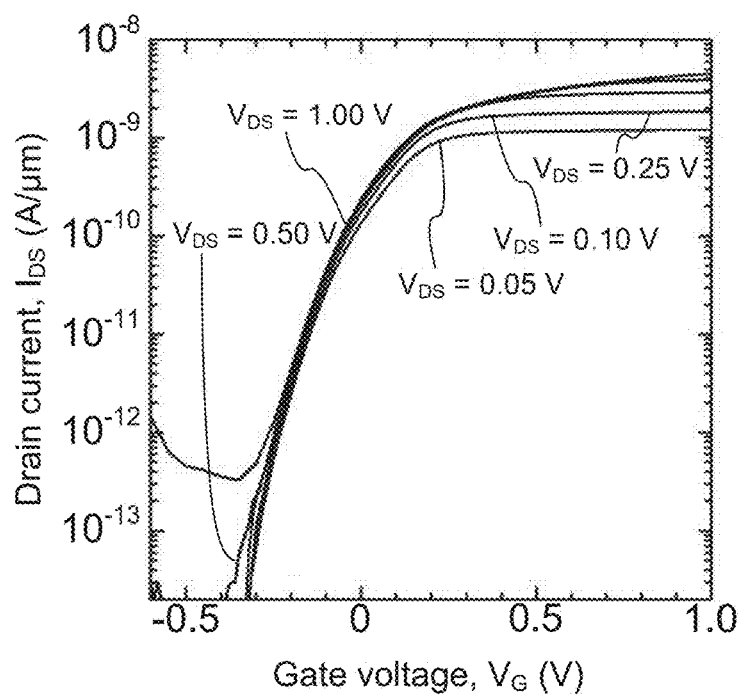
FIG. 14A is a graph illustrating a relationship between a gate voltage and a drain current in a TFET-2.
Figure 14B:
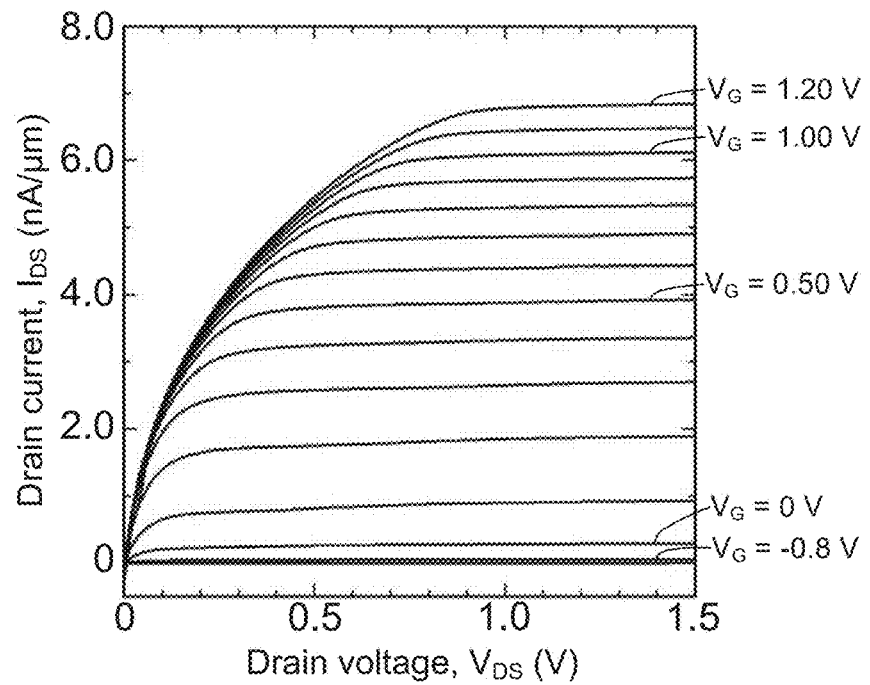
FIG. 14B is a graph illustrating a relationship between a drain voltage and a drain current in a TFET-2.

FIG. 13A is a graph illustrating a relationship between the gate voltage ($V_G$) and the drain current ($I_{DS}$) in the TFET-1 (Example) ($V_{DS}$=0.05, 0.10, 0.25, 0.50, 1.00 V). FIG. 13B is a graph illustrating a relationship between the drain voltage ($V_{DS}$) and the drain current ($I_{DS}$) in the TFET-1 (Example) ($V_G$=−0.40 to 0.70 V in a unit of 0.05 V). FIG. 14A is a graph illustrating a relationship between the gate voltage ($V_G$) and the drain current ($I_{DS}$) in the TFET-2 (comparative example) ($V_{DS}$=0.05, 0.10, 0.25, 0.50, 1.00 V). FIG. 14B is a graph illustrating a relationship between the drain voltage ($V_{DS}$) and the drain current ($I_{DS}$) in the TFET-2 (comparative example) ($V_G$=−0.8 to 1.20 V in a unit of 0.10 V).

As illustrated in FIGS. 14A and 14B, in the TFET-2 of the comparative example that does not have the high-electron-mobility-transistor (HEMT) structure, the ON current was approximately 4 nA/μm when the drain voltage ($V_{DS}$) is 0.5 V. On the other hand, as illustrated in FIGS. 13A and 13B, in the TFET-1 of the Example that has the high-electron-mobility-transistor (HEMT) structure, the ON current was approximately 3.5 μA/μm (875 times) when the drain voltage ($V_{DS}$) is 0.5 V. It can be said from these results that the current value of the tunnel-field-effect transistor according to the embodiment of the present invention is large.

This application is entitled to and claims the benefit of Japanese Patent Application No. 2015-193196 filed on Sep. 30, 2015, the disclosure each of which including the specification, drawings and abstract is incorporated herein by reference in its entirety.

INDUSTRIAL APPLICABILITY

The field effect transistor of the present invention is useful as a switch element formed on a semiconductor microprocessor and a large scale integrated circuit, for example.

REFERENCE SIGNS LIST

100 Tunnel-field-effect transistor
110 Substrate
120 Insulating film
130 Core-multishell nanowire
131 Center nanowire
132 First region
133 Second region
134 Barrier layer
135 Modulation dope layer
136 Cap layer
137 First spacer layer
138 Second spacer layer
140 Source electrode
150 Drain electrode
160 Gate insulating film
170 Gate electrode
180 Isolation protective film

The invention claimed is:
1. A tunnel-field-effect transistor comprising:
a substrate
a core-multishell nanowire including a channel connected with the substrate, the channel being disposed in a center of the core-multishell nanowire;
one of a source electrode and a drain electrode connected with the substrate;
the other of the source electrode and the drain electrode connected with the core-multishell nanowire;
a gate insulating film disposed on a side surface of the core-multishell nanowire;
and
a gate electrode disposed on the gate insulating film so as to surround the core-multishell nanowire, the date electrode being configured to operate such that an electric field acts on at least a art of the core-multishell nanowire to cause tunneling at a junction interface between the substrate and the channel while generating two-dimensional electron gas at the channel.
2. The tunnel-field-effect transistor according to claim 1, wherein:
the substrate includes a (111) surface and group IV semiconductor doped to be a first conductivity type, the (111) surface being covered by an insulating film including an opening;
the core-multishell nanowire includes a group III-V compound semiconductor, the core-multishell nanowire being disposed on the (111) surface of the substrate exposed in the opening and on the insulating film at a peripheral portion of the opening;
the core-multishell nanowire includes:
a center nanowire including, a group III-V compound semiconductor, the center nanowire including a first region connected with the (111) surface of the substrate exposed in the opening, and a second region connected with the first region and doped to be a second conductivity type different from the first conductivity type, the center nanowire being the channel,
a barrier layer including a group III-V compound semiconductor having a band gap greater than a band gap of the group III-V compound semiconductor of the center nanowire, the barrier layer covering a side surface of the center nanowire,
a modulation dope layer including a group III-V compound semiconductor of the second conductivity type having a band gap greater than the band gap of the group III-V compound semiconductor of the center nanowire and smaller than the band gap of the group III-V compound semiconductor of the barrier layer, the modulation dope layer covering the barrier layer, and
a cap layer including a group III-V compound semiconductor having a band gap equal to or greater than the group III-V compound semiconductor of the center nanowire, the cap layer covering the modulation dope layer;
the first region is an intrinsic semiconductor, or is doped to be the second conductivity type such that an impurity concentration of the first region is lower than an impurity concentration of the second region;
the barrier layer is an intrinsic semiconductor, or is doped to be the second conductivity type such that an impurity concentration of the barrier layer is lower than an impurity concentration of the modulation dope layer;
the cap layer is an intrinsic semiconductor, or is doped to be the second conductivity type such that an impurity concentration of the cap layer is lower than the impurity concentration of the modulation dope layer;
the other of the source electrode and the drain electrode is connected with the second region of the center nanowire; and
the gate electrode operates such that an electric field acts on a junction interface between the (111) surface of the substrate and the center nanowire and the first region of the center nanowire to cause tunneling at the junction interface while generating the two-dimensional electron gas at the first region.

3. The tunnel-field-effect transistor according to claim 2, wherein:
the core-multishell nanowire further includes:
a first spacer layer disposed between the barrier layer and the modulation dope layer, wherein the first spacer layer includes a group III-V compound semiconductor having a composition identical to a composition of the group III-V compound semiconductor of the modulation dope layer, and
a second spacer layer disposed between the modulation dope layer and the cap layer, wherein the second spacer later includes a group III-V compound semiconductor having a composition identical to the composition of the group III-V compound semiconductor of the modulation dope layer and to the composition of the group III-V compound semiconductor of the first spacer layer; and
a band gap of the first spacer layer and a band gap of the second spacer layer are greater than the band gap of the group III-V compound semiconductor of the center nanowire and smaller than the band gap of the group III-V compound semiconductor of the barrier layer.

4. The tunnel-field-effect transistor according to claim 2, wherein the impurity concentration of the modulation dope layer falls within a range of $10^{17}$ to $10^{21}$ cm$^{-3}$.

5. A switch element comprising the tunnel-field-effect transistor according to claim 1.

* * * * *